(12) United States Patent
Rajagopalan et al.

(10) Patent No.: US 8,329,575 B2
(45) Date of Patent: Dec. 11, 2012

(54) FABRICATION OF THROUGH-SILICON VIAS ON SILICON WAFERS

(75) Inventors: Nagarajan Rajagopalan, Santa Clara, CA (US); Ji Ae Park, Santa Clara, CA (US); Ryan Yamase, Santa Clara, CA (US); Shamik Patel, Redlands, CA (US); Thomas Nowak, Cupertino, CA (US); Li-Qun Xia, Cupertino, CA (US); Bok Hoen Kim, San Jose, CA (US); Ran Ding, Sunnyvale, CA (US); Jim Baldino, Portland, OR (US); Mehul Naik, San Jose, CA (US); Sesh Ramaswami, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/977,060

(22) Filed: Dec. 22, 2010

(65) Prior Publication Data

US 2012/0164829 A1 Jun. 28, 2012

(51) Int. Cl.
*H01L 21/4763* (2006.01)
*H01L 21/44* (2006.01)
*H01L 21/31* (2006.01)

(52) U.S. Cl. ........ 438/643; 438/653; 438/789; 438/792; 257/E21.584

(58) Field of Classification Search ................... 438/667, 438/643, 653, 67, 789, 792; 257/E21.584
See application file for complete search history.

(56) References Cited

U.S. PATENT DOCUMENTS

| 4,872,947 | A | 10/1989 | Wang et al. |
| 4,892,753 | A | 1/1990 | Wang et al. |
| 5,573,962 | A | 11/1996 | Sung |
| 5,691,215 | A | 11/1997 | Dai et al. |
| 5,691,250 | A | 11/1997 | Cheng et al. |
| 5,710,076 | A | 1/1998 | Dai et al. |
| 5,792,690 | A | 8/1998 | Sung |
| 5,795,820 | A * | 8/1998 | Kepler .......................... 438/624 |
| 5,858,882 | A | 1/1999 | Chang et al. |
| RE36,623 | E | 3/2000 | Wang et al. |
| 6,177,350 | B1 | 1/2001 | Sundarrajan et al. |
| 6,274,426 | B1 | 8/2001 | Lee et al. |
| 6,277,757 | B1 | 8/2001 | Lin |

(Continued)

FOREIGN PATENT DOCUMENTS

WO WO2004109770 12/2004

OTHER PUBLICATIONS

PCT Search Report of International application No. PCT/US2011/064179 dated Jun. 29, 2012.

*Primary Examiner* — Kevin Parendo
(74) *Attorney, Agent, or Firm* — Ashok K. Janah; Janah & Associatees, P.C.

(57) ABSTRACT

A through-silicon via fabrication method includes etching a plurality of through holes in a silicon plate. An oxide liner is deposited on the surface of the silicon plate and on the sidewalls and bottom wall of the through holes. A metallic conductor is then deposited in the through holes. In another version, which may be used concurrently with the oxide liner, a silicon nitride passivation layer is deposited on the exposed back surface of the silicon plate of the substrate.

24 Claims, 16 Drawing Sheets

U.S. PATENT DOCUMENTS

| | | |
|---|---|---|
| 6,352,938 B2 * | 3/2002 | Chen et al. .................... 438/725 |
| 6,355,571 B1 | 3/2002 | Huang et al. |
| 6,426,285 B1 | 7/2002 | Chen et al. |
| 6,492,245 B1 | 12/2002 | Liu et al. |
| 6,503,851 B2 | 1/2003 | Budge et al. |
| 2001/0000160 A1 | 4/2001 | Schwaiger et al. |
| 2003/0064581 A1 | 4/2003 | Pan et al. |
| 2003/0092248 A1 | 5/2003 | Budge et al. |
| 2003/0236003 A1 * | 12/2003 | Koo et al. .................... 438/795 |
| 2004/0029402 A1 | 2/2004 | Budge et al. |
| 2006/0033212 A1 * | 2/2006 | Kim et al. .................... 257/738 |
| 2006/0177599 A1 * | 8/2006 | Madocks ....................... 427/569 |
| 2007/0096264 A1 * | 5/2007 | Wu et al. ....................... 257/635 |
| 2007/0197023 A1 * | 8/2007 | Widodo et al. ............... 438/627 |
| 2007/0290292 A1 * | 12/2007 | Lee et al. ...................... 257/506 |
| 2008/0081457 A1 * | 4/2008 | Lin et al. ....................... 438/614 |
| 2008/0308910 A1 | 12/2008 | Farnworth et al. |
| 2010/0164117 A1 | 7/2010 | Chen |
| 2010/0178766 A1 | 7/2010 | Andry et al. |
| 2010/0237502 A1 * | 9/2010 | Yu et al. ........................ 257/751 |
| 2011/0034036 A1 * | 2/2011 | Kwon ............................ 438/763 |
| 2011/0049717 A1 * | 3/2011 | West .............................. 257/751 |
| 2011/0147938 A1 | 6/2011 | Kang |
| 2011/0318502 A1 | 12/2011 | Giles et al. |

* cited by examiner

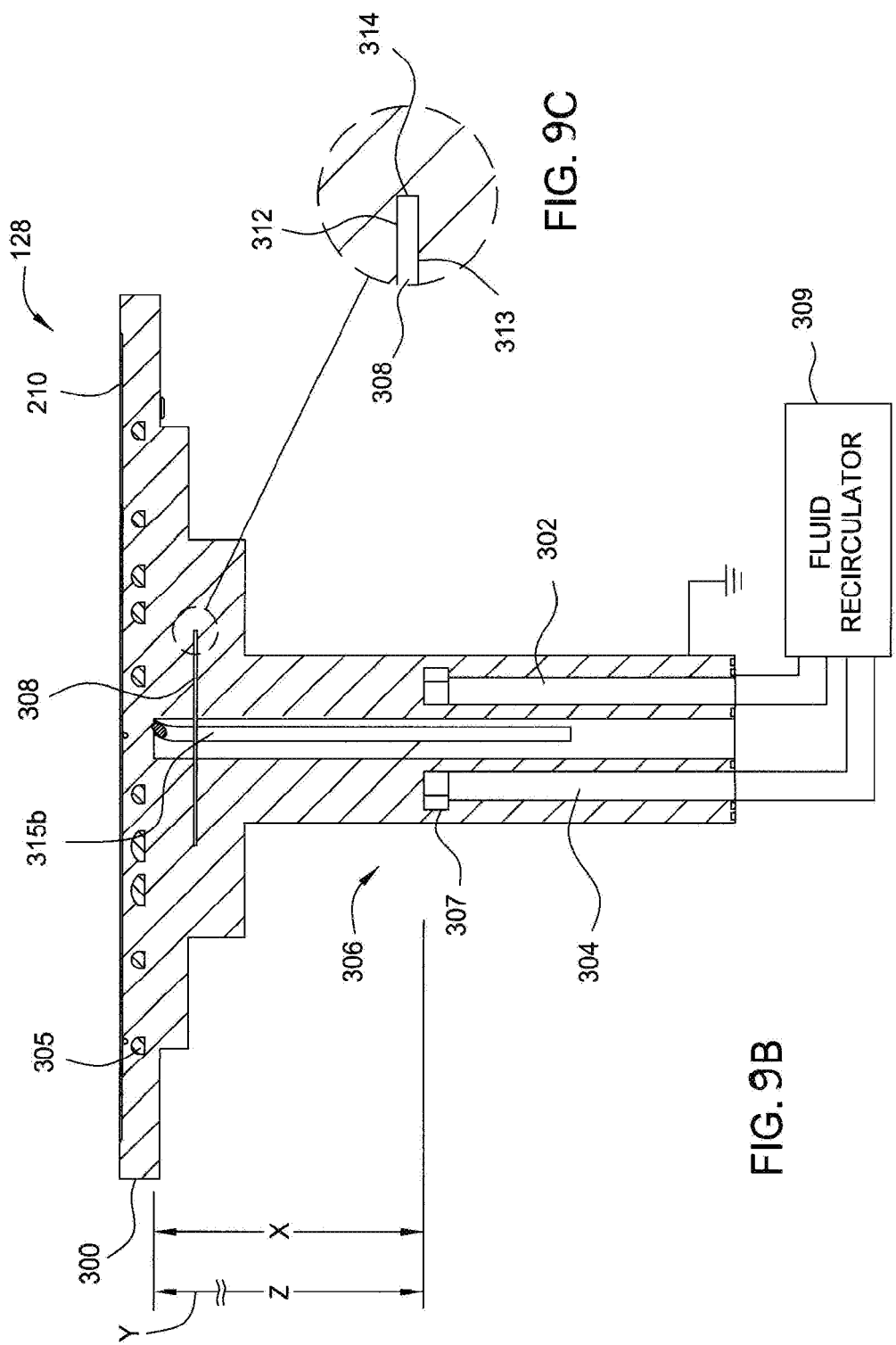

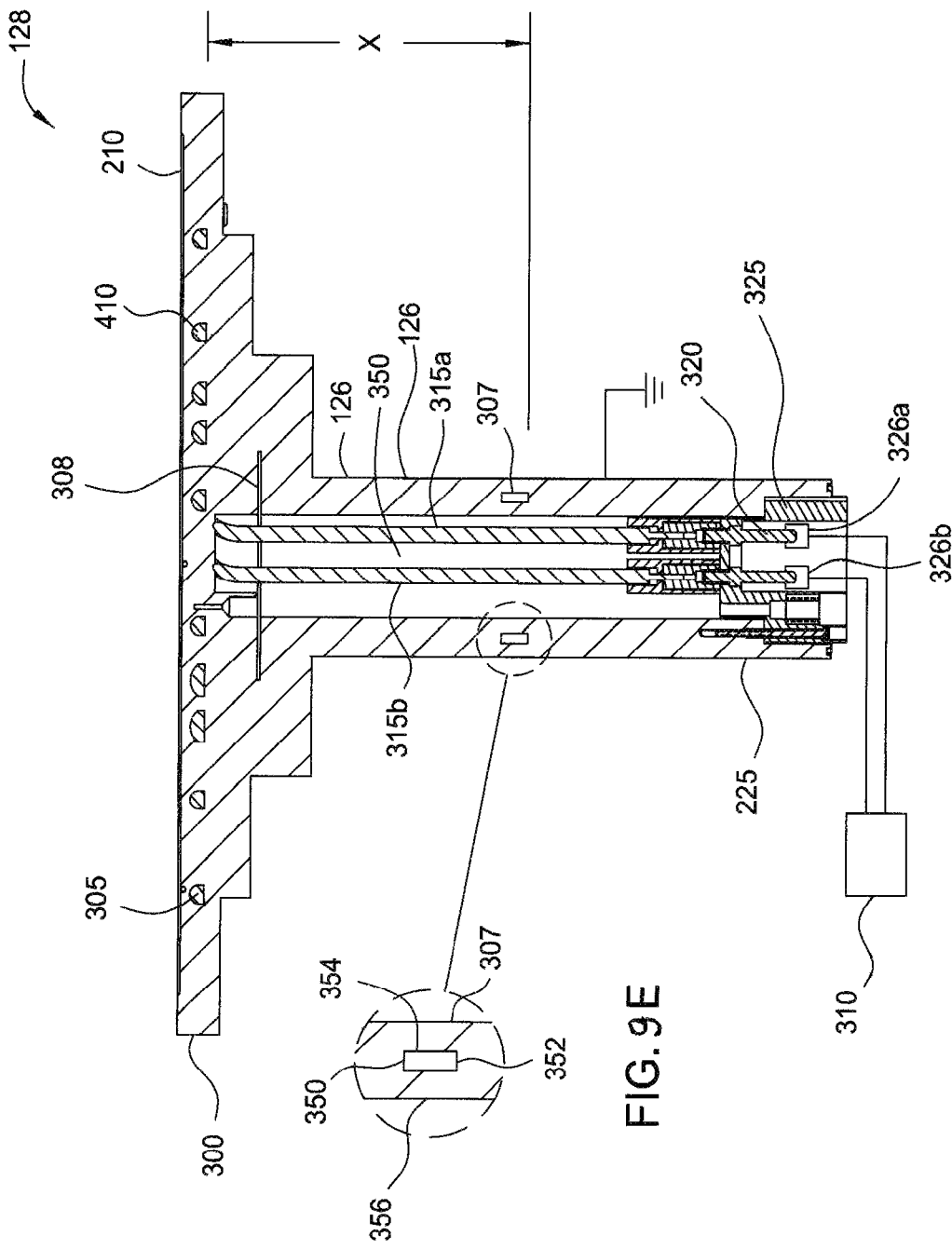

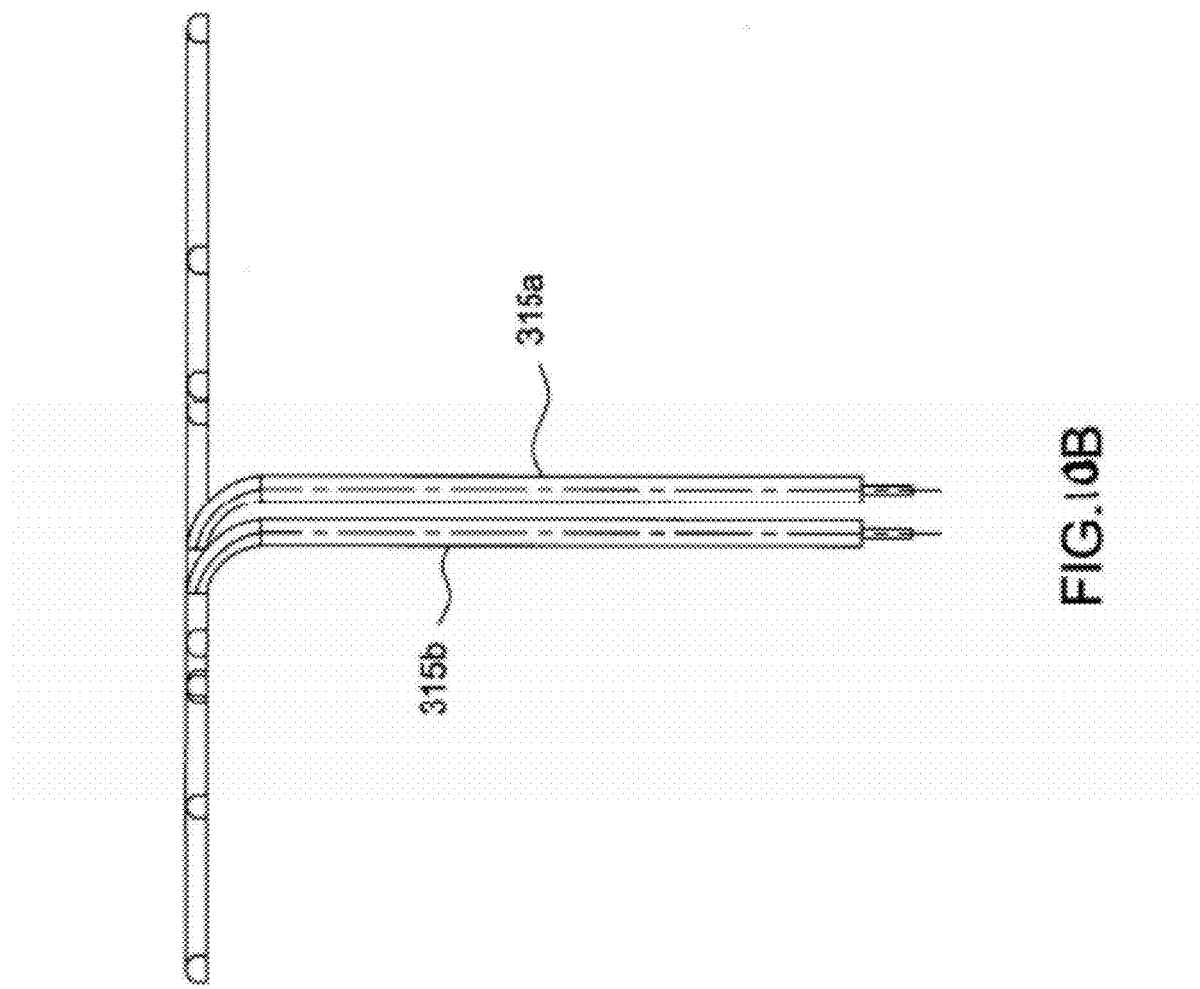

FABRICATION OF THROUGH-SILICON VIAS ON SILICON WAFERS

BACKGROUND

Embodiments of the present invention relate to the fabrication of through-silicon vias used in electronic circuits.

Electronic circuits, such as, for example, integrated, display, memory, power, and photovoltaic circuits, are being developed with active and passive features which are ever smaller. Three-dimensional (3D) structures of electronic circuits are formed by vertically stacking a plurality of substrates, which each have features thereon, in a multilayer stacked structure. The features of the different substrates are connected to one another with conventional wire bonds located outside the perimeter edges of the substrates. However, the resultant 3D circuit structures cover larger areas because the wire bonds extend outside the stacked substrates, increasing the circuit size and reducing the areal density of the circuit.

Through-silicon vias (TSV) are being used to electrically connect features of circuits in vertically disposed layers to provide 3D circuit structures having higher areal densities and which are absent side wires. In TSV fabrication, vias are etched in a silicon-containing substrate, such as a silicon wafer or glass panel with a silicon layer, which can already have prefabricated circuits. The etched vias are filled with an electrical conductor, e.g., a metallic conductor comprising a metal such as copper (Cu), silver (Ag), gold (Au), tungsten (W), and solder; or doped semiconductors, e.g., polysilicon. Dielectric layers such as silicon oxide and silicon nitride layers can also be used to line the walls of the vias before depositing the metallic conductor therein to serve as diffusion barriers, hermetic seals, and other insulating, diffusion barrier or permeation-reducing layers. Multiple substrates are then stacked and vertical electrical connections are formed by the TSVs to connect overlying or underlying features and portions of the resultant three-dimensional circuit. These 3D structures are commonly known as 3D packages, System in Package, or Chip Stack MCM. TSVs allow increased functionality in a smaller areal "footprint" and can also provide faster operating speeds by substantially shortening the electrical paths between the vertically stacked, overlying circuits, as compared with wire bonding methods.

In certain TSV fabrication processes, a substrate comprising a silicon plate, such as a silicon wafer is bonded to a support panel, such as a glass panel, to protect the fragile silicon wafer during fabrication of the TSVs. However, the silicon wafer is often bonded to the support panel using a bonding adhesive which deteriorates at temperatures above 250° C. Conventional processes for the deposition of materials into the TSV features, especially dielectric deposition methods, are conducted at higher temperatures than the deterioration temperature of the adhesive bond material. As a result, the bonding adhesive thermally degrades during processing, resulting in breakage, damage, or failure of the TSV circuit being fabricated. The temperature degradation problems in the fabrication of TSVs have not been resolved by conventional processing methods.

Thus, for various reasons that include these and other deficiencies, and despite the development of various methods of depositing dielectric and other materials in TSV features, further improvements in the fabrication of TSV features are continuously being sought.

SUMMARY

A through-silicon via fabrication method comprises etching a plurality of through holes in a silicon plate, the through holes comprising sidewalls and bottom walls. An oxide liner is deposited on the sidewalls and bottom wall of the through holes by: providing the silicon plate in a process zone comprising process electrodes and a gas distributor; introducing into the process zone, a deposition gas comprising a silicon-containing gas comprising tetraethylorthosilane, and an oxygen precursor comprising oxygen gas; and energizing the deposition gas to form a plasma by applying a current at a first frequency to the process electrodes at a power level of from about 200 watts to about 1500 watts. A metallic conductor is then deposited in the through holes.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 9B is a cross-sectional side view of one embodiment of the substrate support taken along lines 9B-9B of FIG. 9A;

FIG. 9C is an enlarged portion of the cross-sectional view of one embodiment of the substrate support of FIG. 9B;

FIG. 9D is a cross-sectional side view taken along lines 9D-9D of FIG. 9A;

FIG. 9E is an enlarged portion of the cross-sectional view of one embodiment of the substrate support of FIG. 9D;

DESCRIPTION

Figure 1A:
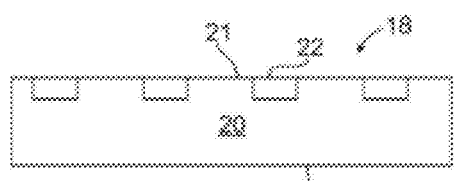
FIG. 1A is a schematic sectional diagram of a substrate comprising a silicon plate having electronic circuits comprising active and passive features thereon.
Figure 1B:
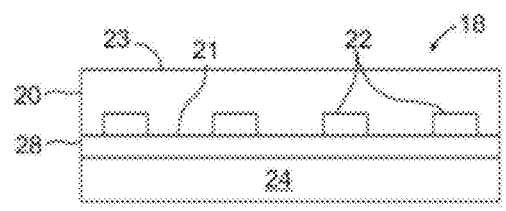
FIG. 1B is a schematic sectional diagram showing the substrate of FIG. 1A flipped over and bonded to a carrier.
Figure 1C:
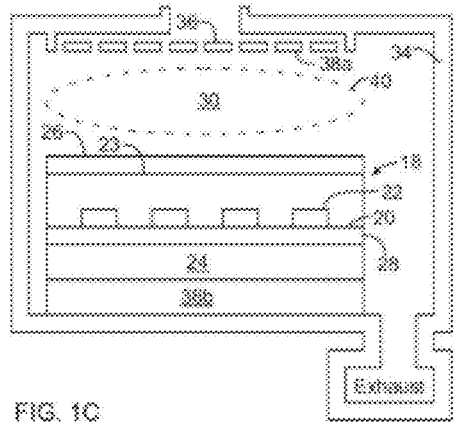
FIG. 1C is a schematic diagram of a deposition chamber showing the deposition of a silicon nitride passivation layer on the exposed surface of a substrate.
Figure 1D:
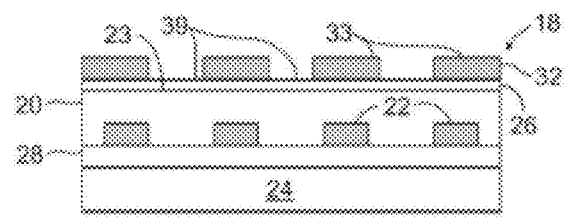
FIG. 1D is a schematic diagram showing an etch resistant layer comprising patterned resist features on the substrate.
Figure 1E:
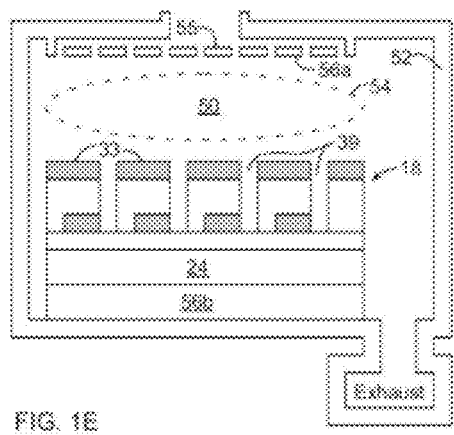
FIG. 1E is a schematic diagram of an etching chamber showing the etching of through holes in the exposed regions of the silicon plate that lie between the patterned resist features.
Figure 1F:
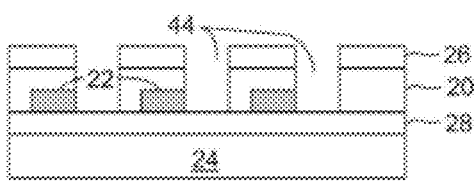
FIG. 1F is a schematic diagram showing the completed through holes etched through the silicon plate supported by the carrier.
Figure 1G:
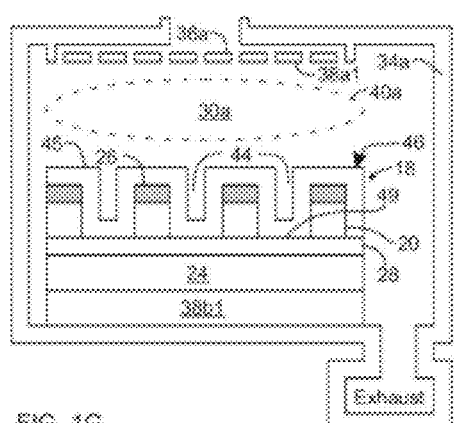
FIG. 1G is a schematic diagram showing the deposition of an oxide liner on the silicon plate and the exposed surfaces of the through holes of the substrate in a deposition chamber.
Figure 1H:
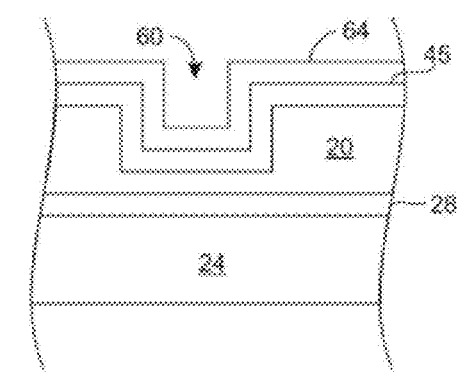
FIG. 1H is a schematic diagram showing the deposition of a sealing layer over the oxide liner on the silicon plate.
Figure 1I:
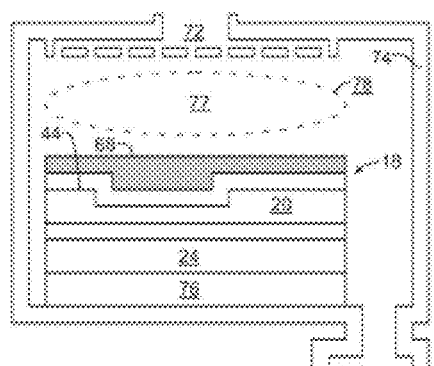
FIG. 1I is a schematic diagram showing the deposition of a silicon nitride passivation layer on the exposed surface of a substrate.
Figure 1J:
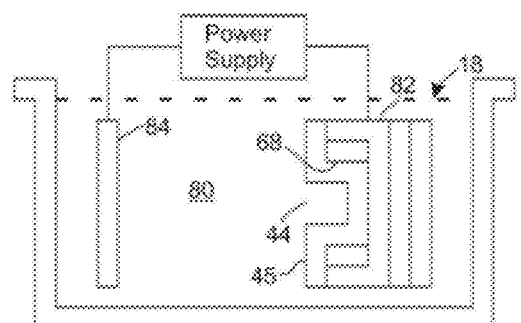
FIG. 1J is a schematic diagram showing the deposition of a metallic conductor comprising an electroplated metal into the through holes of the silicon plate in an electroplating bath.
Figure 1K:
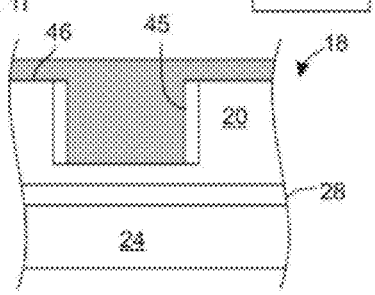
FIG. 1K is a schematic diagram showing the metallic conductor deposited in the through holes in the silicon plate.
Figure 1L:
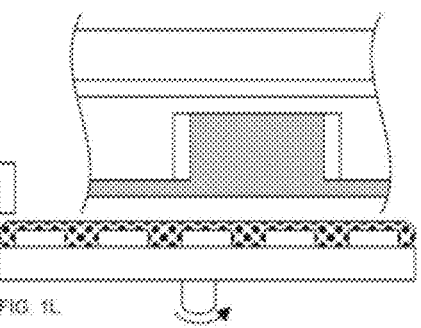
FIG. 1L is a schematic diagram showing chemical mechanical polishing of the excess metallic conductor deposited on the surface of the silicon plate.
Figure 1M:
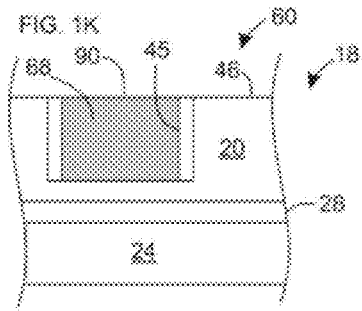
FIG. 1M is a schematic diagram showing the exposed contact portions of the metallic conductor of the through holes in the silicon plate.
Figure 1N:
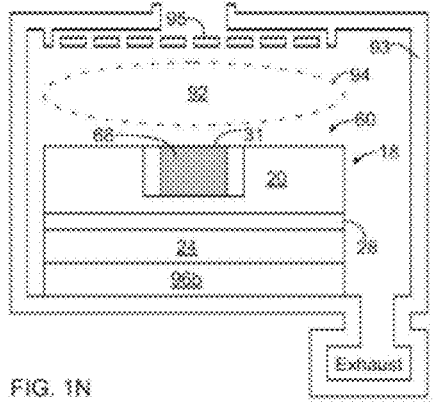
FIG. 1N is a schematic diagram showing the reduction and removal of the native oxide layer on the metal-containing portions of a substrate.
Figure 1O:
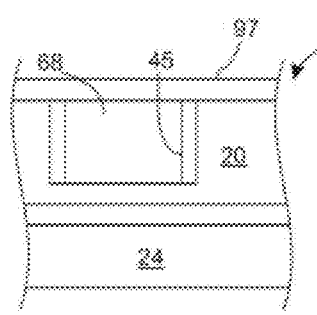
FIG. 1O is a schematic diagram showing a protective coating deposited on the cleaned metallic conductor and substrate surface.
Figure 1P:
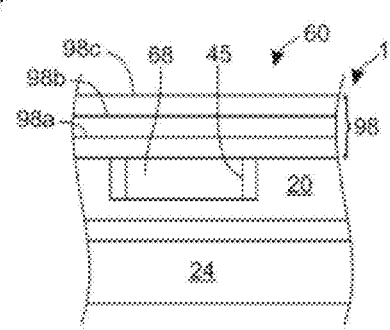
FIG. 1P is a schematic diagram showing a protective coating comprising a tri-layer coating deposited on the cleaned metallic conductor and substrate surface.
Figure 1Q:
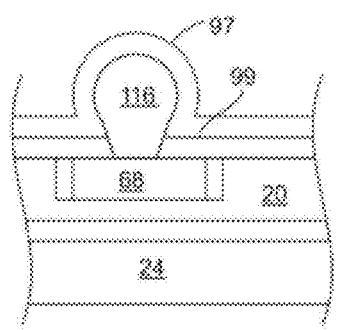
FIG. 1Q is a schematic diagram showing a connector bump contacting the cleaned metallic conductor with a surrounding polyimide coating.

Through-silicon vias (TSVs) are typically fabricated in a substrate 18 comprising a silicon plate 20, using a number of different sequentially performed processes, as shown for example in FIGS. 1A to 1Q. The silicon plate 20 is the receptacle for the through-silicon vias and can be, for example: polycrystalline silicon; a silicon wafer composed of monocrystalline silicon; or other forms of crystalline or amorphous silicon. Exemplary through-silicon via fabrication processes are described herein, with an illustrative example being shown in FIG. 2. However, other processes that would be apparent to those of ordinary skill in the art can also be used, and all such combinations of processes fall within the scope of the present invention. Also, the exemplary process steps described herein can be performed in different sequences, substituted with other process steps, or eliminated entirely, without deviating from the scope of the present claims. Thus, the claims should not be limited to the exemplary and illustrative processes and apparatus described herein.

In one exemplary embodiment, the substrate 18 includes a silicon plate 20 having a front surface 21 with one or more of the features 22 therein, and a back surface 23, as shown in FIG. 1A. The features 22 can be already fabricated on the silicon plate 20, as per FIG. 2, or fabricated afterwards. The features 22 can include, for example: electronic circuits such as integrated circuits, memory chips, displays, photovoltaic cells, or other circuits; active features such as transistors; and passive features such as resistors and capacitors. In the example shown, the features 22 are formed on a front surface 21 to extend downwards into the silicon plate 20. A thin conductor layer (not shown) comprising interconnect lines, contact holes and/or other electrically conducting features, can also be formed on the front surface 21 of the silicon plate 20 to connect to the features 22 or for other connecting applications.

The silicon plate 20 is flipped over and mounted on a carrier 24 to expose the back surface 23 of the silicon plate 20, as shown in FIG. 1B. The carrier 24 supports the silicon plate 20 during fabrication of the through-silicon vias. A suitable carrier 24 can be, for example, a glass, polymer, ceramic, or semiconductor plate; or can be made from other materials. In one embodiment, the carrier 24 is either a silicon wafer or a glass plate.

Figure 2:
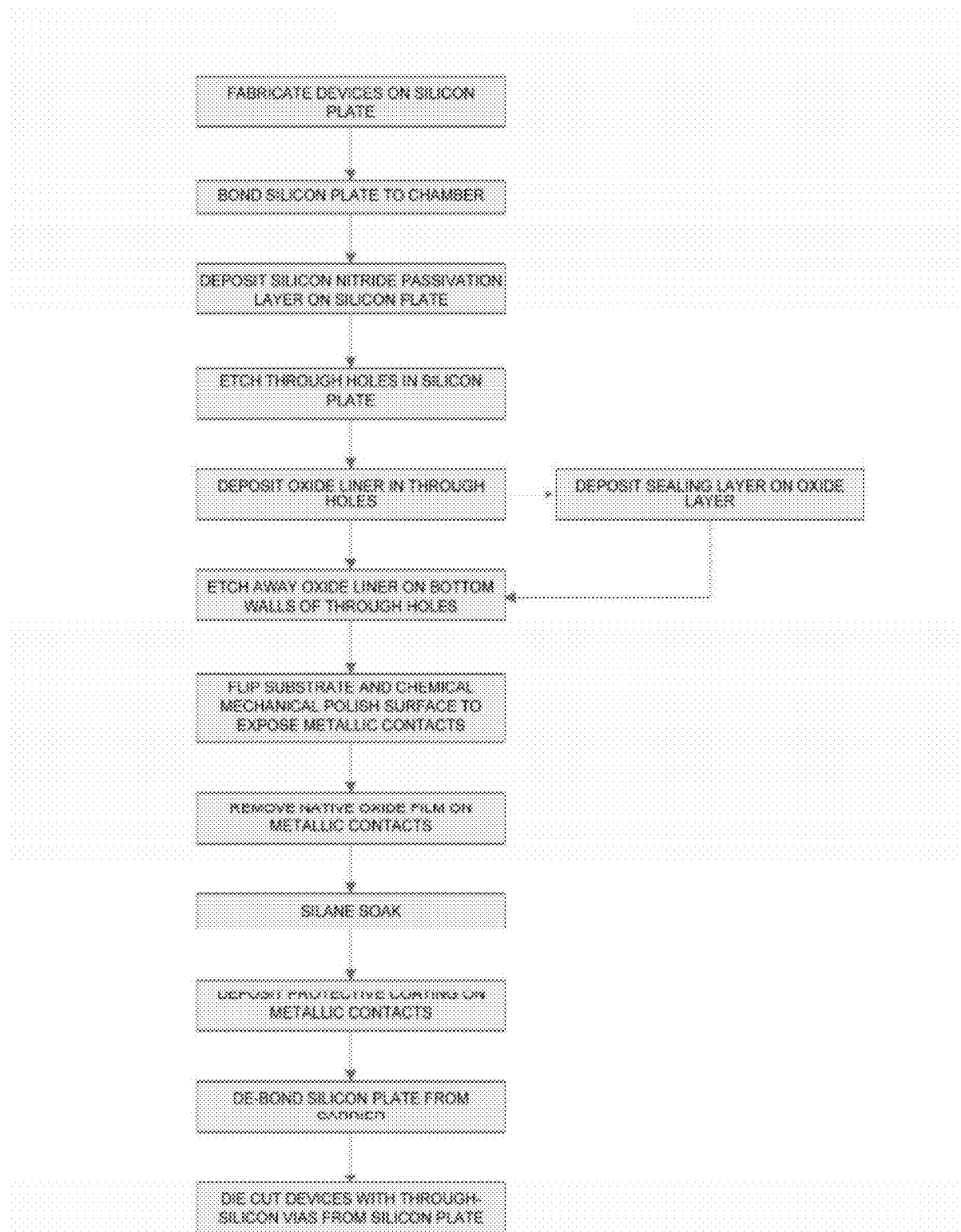
FIG. 2 is a flow chart of an exemplary version of a process for forming TSV features on a silicon plate of a substrate.

The front surface 21 of the silicon plate 20 can be bonded to the carrier 24 as per FIG. 2, with an adhesive layer 28 therebetween, to expose the back surface 23 of the silicon plate 20 which now becomes the exposed processing surface 23 of the resultant substrate 18. A suitable adhesive layer 28 includes, for example, thermoplastic adhesive, such as a thermoplastic resin that is UV or heat curable. Suitable adhesive layers 28 are manufactured by Brewer Science, Rolla, Mo., or 3M Corp., St. Paul, Minn. Certain thermoplastic resins flow and cure at temperatures of less than 350° C., or even less than 250° C., or even at about 200° C.

Silicon Nitride Passivation Layer

In one optional process step, a silicon nitride passivation layer 26 is deposited on the exposed surface 23 of the substrate 18, as shown in FIG. 1C. The silicon nitride passivation layer 26 is used as a stress compensation layer when the substrate 18 exhibits a shape distortion, such as warping or other distortions, after the silicon plate 20 is bonded to the carrier 24. The silicon nitride passivation layer 26 can also be used as a preventive stress compensation layer when the substrate 18 is known to suffer a shape distortion in later process steps. The silicon nitride passivation layer 26 adjusts the shape of the substrate 18 by countering stresses induced into the substrate 18 that would otherwise warp or distort the shape of the substrate 18. For example, in a warped state, the substrate 18 can bow and partially curve inward along its peripheral edge to define a convex or concave shaped surface, with the central portion of the substrate 18 being higher or lower than the peripheral edge of the substrate 18. Warping can occur during bonding or heating stages in any of the processes, or grinding or polishing steps which remove a portion of the silicon plate 20, all of which can cause uneven stresses to form between the silicon plate 20 and the underlying carrier 24. The silicon nitride passivation layer 26 reduces such shape distortion and can also serve as a moisture barrier, and can even hermetically seal the underlying features 22 from the environment.

The silicon nitride passivation layer 26 is deposited on the exposed surface 23 of the substrate 18, as per FIG. 2, in a deposition zone 30 of a deposition chamber 34 comprising a gas distributor 36 and process electrodes 38a,b. In one embodiment, the substrate 18 is transferred into the deposition zone 30 and maintained at a set spacing from a surface of the gas distributor 36, e.g., of from about 7.5 mm (300 mils) to about 20 mm (about 750 mils). A deposition gas 40, comprising a silicon-containing gas such as silane ($SiH_4$) and a nitrogen-containing gas such as ammonia ($NH_3$), is introduced into the chamber 34. A diluent gas which can stabilize the plasma or generate more uniform deposition thickness across the substrate 18 can also be added to the process gas. Suitable diluent gases include nitrogen ($N_2$), helium (He), or argon (Ar). In one embodiment, the deposition gas 40 comprises silane at a flow rate of from about 50 to about 1000 sccm (e.g., about 650 sccm); ammonia in a flow rate of from about 100 sccm to about 1000 sccm; and a diluent gas comprising nitrogen at a flow rate of from about 500 to about 25,000 sccm (e.g., about 22,000 sccm). The deposition gas in the deposition zone 30 is maintained at a pressure of from about 2 Torr to about 5.5 Torr (e.g., about 3.5 Torr). During the deposition process, the substrate 18 is maintained at a temperature of from about 100° C. to about 220° C. (e.g., about 180° C.). Advantageously, the low pressure deposition process reduces fluxing or reflow of the adhesive layer 28 used to join the silicon plate 20 to the underlying carrier 24. The plasma can be sustained by applying a current at a primary frequency of 13.6 MHz to the process electrodes 38a,b at a power level of from about 500 watts to about 1600 watts (e.g., about 1100 watts). In addition, the plasma can be enhanced by also applying a low-frequency power at a secondary frequency of about 350 kHz, and at a power level of from about 10 watts to about 200 watts. The resultant process plasma deposits a silicon nitride passivation layer 26 on the surface 23 of the substrate 18 which can serve as both a stress compensation layer and a moisture barrier layer. The passivation layer 26 has a density of from about 2 $g/cm^3$ to about 3 $g/cm^3$, e.g., about 2.2 $g/cm^3$. The passivation layer 26 can be deposited to a thickness of from about 0.1 microns to about 10 microns.

Figure 3:
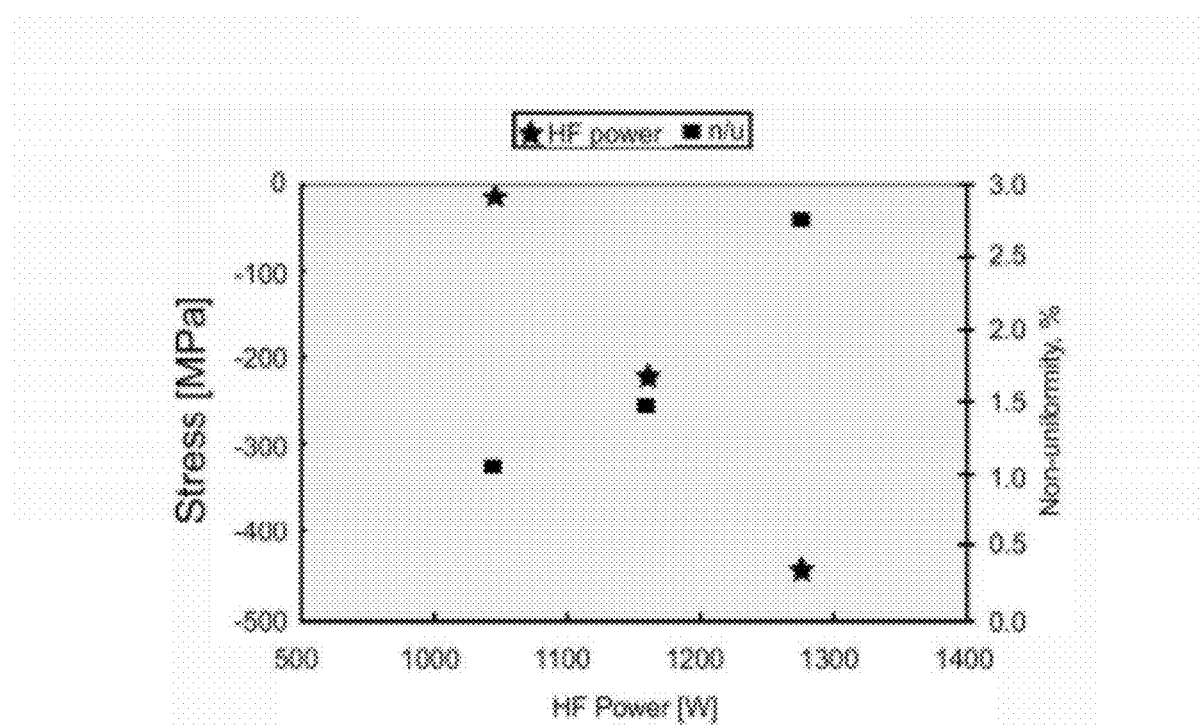
FIG. 3 is a graph showing the change in stress levels or refractive index of the deposited silicon nitride passivation layer for increasing power level of primary frequency current applied to the process electrodes.

The silicon nitride deposition process as described above has several advantages and benefits. First, it was found that the intrinsic stress level of the deposited silicon nitride passivation layer 26 was tunable. Specifically, the power level of the primary frequency (HF) current applied to the process electrodes 38a,b in the deposition zone 30 can be selected to adjust the level of stress in the deposited passivation layer 26. For example, FIG. 3 shows the change in stress level of the deposited silicon nitride passivation layer 26 for increasing power level of HF current applied to the process electrodes 38a,b. It is seen that the intrinsic stress level of the deposited silicon nitride passivation layer 26 gradually reduces from a value of about 0 to about −450 MPa as the power level of the HF current applied to the process electrodes 38a,b is increased from about 1050 watts to about 1280 watts. The negative stress levels represent a measured compressive stress, which was measured by a KLA Tencor SpectraFx 100 tool, fabricated by KLA Tencor, Milpitas, Calif.

The tunable stress level of the silicon nitride passivation layer 26 allows the intrinsic stress desired in the passivation layer 26 to be set to a desired predetermined level by controlling the power level of the HF current applied to the process electrodes 38a,b in the deposition chamber 34 depending on the degree or type of shape distortion observed in the substrate 18, and even prior to deposition of the silicon nitride passivation layer 26. For example, when the surface 23 of the silicon plate 20 is a concave surface, a silicon nitride passivation layer 26 having a tensile stress is desirable to correct and reform the concave shape into a flat or planar surface. As another example, when the surface 23 of the silicon plate 20 is a convex surface, a silicon nitride passivation layer 26 having a compressive stress is desirable to correct and reform the convex surface into a planar surface. Thus, the power level of the primary frequency current applied to the process electrodes 38a,b is selected to adjust the surface 23 of the substrate 18 to a substantially planar surface by selecting a value of the power level of at least about 1050 watts, or even from about 1050 watts to about 1300 watts. The power level of the HF current applied to the process electrodes 38a,b in the deposition chamber 34 can be controlled by a controller which controls the chamber 34 as explained below.

It was further observed that the percent non-uniformity of the substrate 18, as shown on the second Y-axis of FIG. 3, also exhibited a linear correlation to the power level of the primary frequency current applied to the process electrodes 38a,b. For example, when the power level of the HF current applied to the process electrodes 38a,b was increased from about 1050 watts to about 1280 watts, the percent non-uniformity of the deposited silicon nitride passivation layer 26 increased from a value of about 1.2% to a value of about 2.7%. From these results it was determined that the HF power level applied to the electrodes 38a,b should be generally lower to provide better uniformity. The range of power levels selected should allow the non-uniformity of the deposited passivation layer 26 to be maintained at adequately low levels while the intrinsic stress of the silicon nitride passivation layer 26 is maintained at desirable high levels.

Figure 4A:
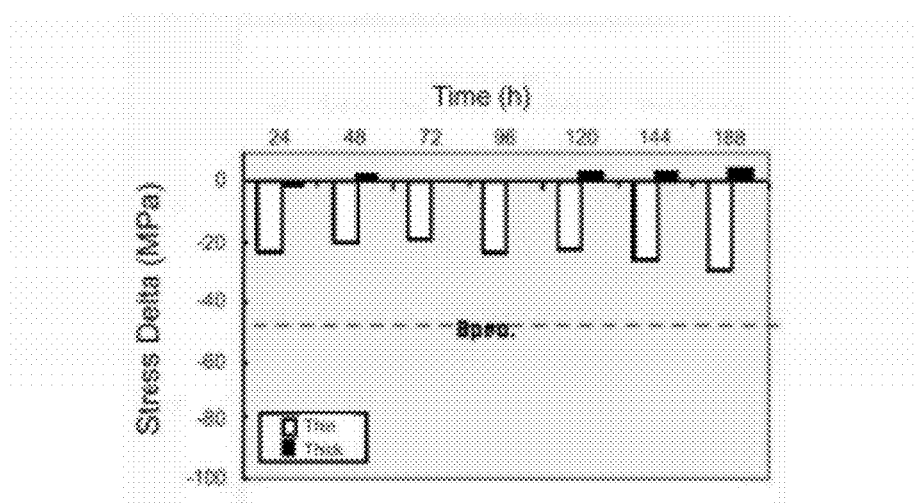
FIG. 4A is a graph showing the delta stress change in measured stress levels for silicon nitride passivation layers deposited to a thickness of 0.5 microns (thick) or 0.05 microns (thin)

The properties measured for the low temperature deposited silicon nitride passivation layer 26 were also unexpected and surprising, especially considering that the layer 26 was deposited at relatively low deposition temperatures of less than about 220° C. FIG. 4A shows the change in measured stress levels over time of two silicon nitride passivation layers 26, namely, "thick" which had a thickness of 0.5 microns, and "thin" which had a thickness of 0.05 microns. It is seen that the thick silicon nitride passivation layer 26 showed a change in stress level of less than 10 MPa after 6 days, and the thin silicon nitride passivation layer 26 showed a change in stress level of less than 5 MPa after 6 days.

Figure 4B:
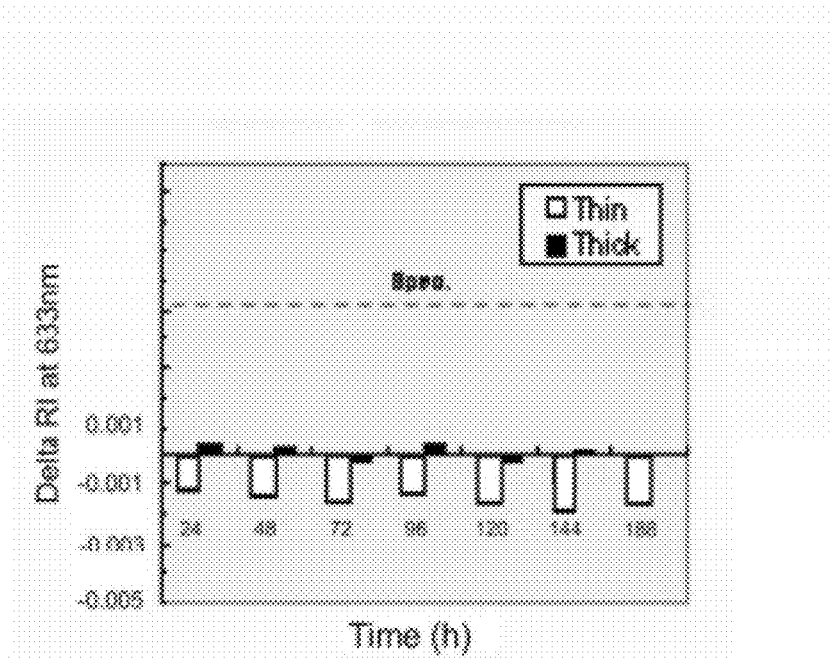
FIG. 4B is a graph showing the delta refractive index measured at 633 nm levels for silicon nitride passivation layers deposited to a thickness of 0.5 microns (thick) or 0.05 microns (thin)

Similarly, the change in refractive index (RI) of the silicon nitride passivation layer 26 was also substantially lower than conventional processes over a time period of about 6 days. FIG. 4B shows the delta refractive index measured at 633 nm using conventional ellipsometry methods for silicon nitride passivation layers 26 deposited to a thickness of 0.5 microns (thick) or 0.05 microns (thin). Again, it is seen that the thick silicon nitride passivation layer 26 showed a change in RI of less than 0.001 after 6 days, and the thin silicon nitride passivation layer 26 showed a change in RI of less than 0.0005 after 6 days.

In another embodiment of the silicon nitride passivation layer deposition process, process conditions are set to deposit a silicon nitride passivation layer 26 having a stress gradient through the thickness of the layer 26. For example, a stress gradient, comprising varying tensile or compressive stress levels through the thickness of the silicon nitride passivation layer 26, can be formed by controlling the process conditions, such as power level of the current applied to the electrodes

38a,b to change the applied power level from a first level to a second level, then optionally a third level, and still optionally, other levels. The profile of the stress gradient is tailored to compensate for the stress induced in the silicon plate 20 at this time or by later processes. Thus, the stress gradient is tailored to have a profile with stress values that are opposite to the profile of the stress within the substrate 18 without the passivation silicon nitride layer 26. This reduces or eliminates the surface warping and bowing of the silicon plate 20 of the substrate 18.

The stress gradient is formed in the silicon nitride passivation layer 26 by changing the plasma density, ion bombardment energy, gas pressure, or flow rate of the components of the process gas. For example, a stress gradient can be formed by a process gas comprising of $SiH_4$, $NH_3$, and $N_2$ provided in the following volumetric flow rates: 1.4:1:40. During the deposition process, the substrate 18 is placed in the deposition chamber 34 as explained before and maintained at a temperature of from about 100° C. to about 200° C. (e.g., about 180° C.). Initially, in a first stage, the chamber pressure is maintained at from about 4 Torr to about 6 Torr (e.g., about 4.2 Torr). Thereafter, in a second stage, the chamber pressure is maintained at a pressure of from about 2 Torr to about 4 Torr (e.g., about 2.2 Torr). The plasma is maintained by applying a current at a power level of from about 1000 watts to about 1300 watts to the chamber electrodes. A silicon nitride passivation layer 26 having a stress gradient can be deposited to a thickness of at least about 10 microns, e.g., from about 0.1 to about 6 microns.

In another version, a fluorine-resistant silicon nitride passivation layer 26 is deposited prior to etching the through-silicon vias. Fluorine-containing gases, for example, $SF_6$, $CF_4$ and other such gases, are often used for etching the silicon material because fluorine ions react with silicon to form volatile silicon-fluoride compounds. However, during the silicon etching process, the fluorine ions can react with, and erode away, the silicon nitride passivation layer 26. This results in more severe undercutting of the silicon nitride passivation layer 26 during the through-silicon via etching process. In this embodiment, a fluorine-resistant silicon nitride passivation layer 26 is deposited prior to etching the through-silicon vias. The fluorine-resistant silicon nitride passivation layer 26 is deposited by doping the silicon nitride layer during deposition with oxygen to dope oxygen into the silicon nitride layer to form a silicon-oxynitride layer. The silicon-oxynitride layer makes the silicon nitride passivation layer 26 more fluorine-resistant, and as such, prevents undercutting of this layer during the silicon etching process. The resultant fluorine-resistant silicon nitride passivation layer 26 is also deposited at the same low temperatures of the previously described layer and has all the desired properties of the silicon nitride passivation layer 26—namely, hermeticity, low stress, and thermal stability—which render the layer suitable for back passivation applications in through-silicon vias. A suitable oxygen content of the fluorine-resistant silicon nitride passivation layer 26 is at least about 10%, or even from about 10% to about 30%.

In one version, the fluorine-resistant silicon nitride passivation layer 26 comprises an oxygen-doped silicon nitride layer that is deposited in a PECVD deposition chamber 34 at deposition temperatures lower than 200° C. For example, the substrate 18 can be transferred into the deposition zone 30 and maintained at a set spacing from a surface of the gas distributor 36, for example, of from about 7.5 mm (300 mils) to about 20 mm (about 750 mils). A deposition gas 40 comprising a silicon-containing gas such as silane ($SiH_4$), a nitrogen-containing gas such as ammonia ($NH_3$), and an oxygen-containing gas such as nitrous oxide ($N_2O$) or carbon dioxide ($CO_2$), is introduced into the chamber 34. A diluent gas which can stabilize the plasma or generate more uniform deposition thickness across the substrate 18 can also be added to the process gas. Suitable diluent gases can include nitrogen ($N_2$), helium (He), or argon (Ar). In one embodiment, the deposition gas 40 comprises silane at a flow rate of from about 50 to about 1000 sccm (e.g., about 720 sccm); ammonia in a flow rate of from about 100 sccm to about 1000 sccm; nitrous oxide or carbon dioxide at a flow rate of from about 500 to about 10,000 sccm; and a diluent gas comprising nitrogen at a flow rate of from about 500 to about 25,000 sccm (e.g., about 9000 sccm). The process gas in the deposition zone 30 is maintained at a pressure of from about 2 Torr to about 5.5 Torr (e.g., about 4.2 Torr). During the deposition process, the substrate 18 is maintained at a temperature of from about 100° C. to about 220° C. (e.g., about 180° C.). The plasma can be sustained by applying a current at a frequency of 13.6 MHz to the process electrodes 38a,b, at a power level of from about 500 watts to about 1600 watts (e.g., about 1350 watts). In addition, the plasma can be enhanced by also applying a low-frequency power at a frequency of about 350 kHz, and at a power level of from about 10 watts to about 200 watts. The resultant process plasma deposits a fluorine-resistant silicon nitride passivation layer 26 comprising a silicon oxynitride layer on the surface 23 of the substrate 18. The passivation layer 26 can be deposited to a thickness of from about 0.1 microns to about 10 microns.

Figure 4C:
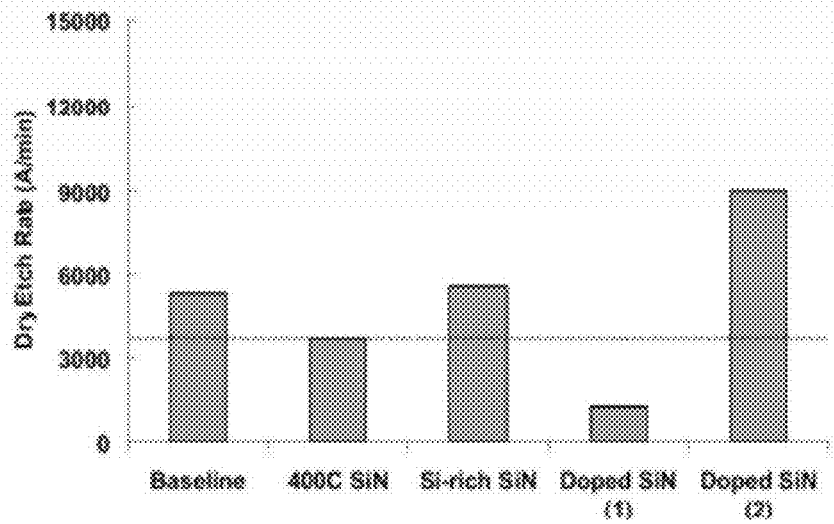
FIG. 4C is a graph showing the dry etch rate of etching of different types of silicon nitride layers deposited on the surface of the substrate.

In the subsequent via etching process, the fluorine radicals erode the oxygen-doped silicon nitride layer at a much slower rate than silicon nitride that is absent oxygen doping. FIG. 4C shows the much lower dry etching rate of the oxygen-doped silicon nitride layer (which is circled) as compared with other silicon nitride layers that are absent oxygen. Even other forms of dopant as represented by the last layer of the graph did not etch as slowly as the oxygen-doped silicon nitride layer. The oxygen-doped silicon nitride thus developed at low temperature has desired properties of a good passivation layer as well as low etching rates in fluorine gases.

After deposition of the optional silicon nitride passivation layer, a plurality of through holes 44 are etched through the silicon plate 20 to form the holes for the through-silicon vias (TSVs), as per FIG. 2 and shown in FIG. 1F. Prior to the etching process, the surface of the substrate 18 is coated with an etch-resistant layer 32 which can be a photoresist layer by itself, or a photoresist layer with a hard mask layer such as a silicon dioxide or silicon nitride layer. The various components of the etch-resistant layer 32 are patterned and developed using conventional lithography processes to form a plurality of resist features 33 on the silicon plate 20, as shown in FIG. 1D.

Thereafter, the exposed silicon portions 39 of the silicon plate 20 with the overlying pattern of resist features 33 are etched in an etching process. In the etching process, the substrate 18 is placed in the etching zone 50 of an etching chamber 52, and an etching gas 54 is introduced into the etching zone 50, as shown in FIG. 1E. In one embodiment, the etching gas 54 comprises fluorine-containing gases such as $SF_6$, $CF_4$, $NF_6$, $C_4F_8$, $CHF_3$ and others, and may also optionally include diluent gases such as argon. In one version, the exposed silicon portions 39 of the silicon plate 20 are etched away with an etching gas 54 comprising $SF_6$ at a volumetric flow rate of from about 10 to about 4000 sccm, or even, for example, from about 100 to about 1000 sccm. The plasma is sustained by applying a current at a frequency of 400 KHz or 13.6 MHz to process electrodes 56a,b about the etching zone 50, at a power level of from about 50 watts to about 2000 watts. During the etching process, the substrate 18 is maintained at temperatures of less than about 80° C., for example, from about 20° C. to about 60° C. The substrate 18 is maintained at a spacing from the gas distributor 55 of from about 75 mm (about 3 inches) to about 180 mm (about 7 inches).

The etching plasma etches the exposed silicon portions 39 to form a plurality of through holes 44 therein, as shown in FIG. 1F. Generally, the through holes 44 are substantially vertical and extend through most of the silicon plate 20, or even the entire thickness of the silicon plate 20. In one embodiment, the through holes 44 have aspect ratios (the ratio of the height of the bare hole divided by the width of the hole immediately after etching) of at least about 10:1, or even from about 10:1 to about 15:1. In one embodiment, the through holes 44 have diameters of from about 4 microns to about 50 microns. After the etching process, conventional resist ashing and stripping processes are used to remove the remnants of the resist features 33 on the substrate 18—for example, by using an oxygen-containing plasma to ash the residual resist and other gases, such as halogen gases, to remove any residual hard mask material. The ashing or stripping process can be conducted in the etching chamber 52 or in a different chamber.

Oxide Liner

In one version, an oxide liner 45 is deposited on the surface 46 of the silicon plate 20 as well as the exposed surfaces of the sidewalls 48 and bottom wall 49 of the through holes 44 that were etched into the silicon plate 20, as per FIG. 2 and shown in FIG. 1G. The surface 46 of the silicon plate 20 can be composed of silicon, or can have other layers thereon such as the optional silicon nitride passivation layer 26 (as shown). The oxide liner 45 is deposited with a low temperature plasma-enhanced chemical vapor deposition process in a deposition zone 30a of a deposition chamber 34a. In this process, a deposition gas 40a, comprising a silicon-containing precursor comprising tetraethylorthosilane (TEOS) and an oxygen precursor comprising oxygen gas ($O_2$), is introduced into the deposition zone 30a containing the substrate 18. In one version, the TEOS precursor is transported by a carrier gas such as helium and provided in a mass flow rate of from about 400 mgm (mg/minute) to about 12,000 mgm (e.g., about 3000 mgm). The deposition gas 40a is provided at a flow rate of from about 2000 to about 17,000 sccm (e.g., about 12,000 sccm). The gas pressure in the deposition zone 30a is maintained at a pressure of from about 2 Torr to about 8 Torr (e.g., about 5.5 Torr). During the deposition process, the substrate 18 is maintained at a temperature of less than about 250° C., e.g., from about 100° C. to about 250° C. The substrate 18 is held at a spacing from a gas distributor 36a of from about 5 mm (approx. 200 mils) to about 13 mm (approx. 500 mils). The plasma is maintained by applying a current at a primary frequency of 13.6 MHz to process electrodes 38a1, b1 at a power level of from about 100 watts to about 1200 watts (e.g., 1000 watts). In addition, the plasma can be enhanced by also applying to the process electrodes 38a1,b1, a low-frequency power at a secondary frequency of up to 400 kHz, e.g., 350 KHz. The secondary power can be applied at a power level of from about 10 watts to about 500 watts. The resultant plasma deposits an oxide liner 45 having a density of from about 2 g/cm$^3$ to about 3 g/cm$^3$ (e.g., about 2.2 g/cm$^3$). In one version, the oxide liner 45 is deposited to a thickness of from about 0.1 microns to about 4 microns, or even from about 4 microns to about 6 microns.

Figure 5:
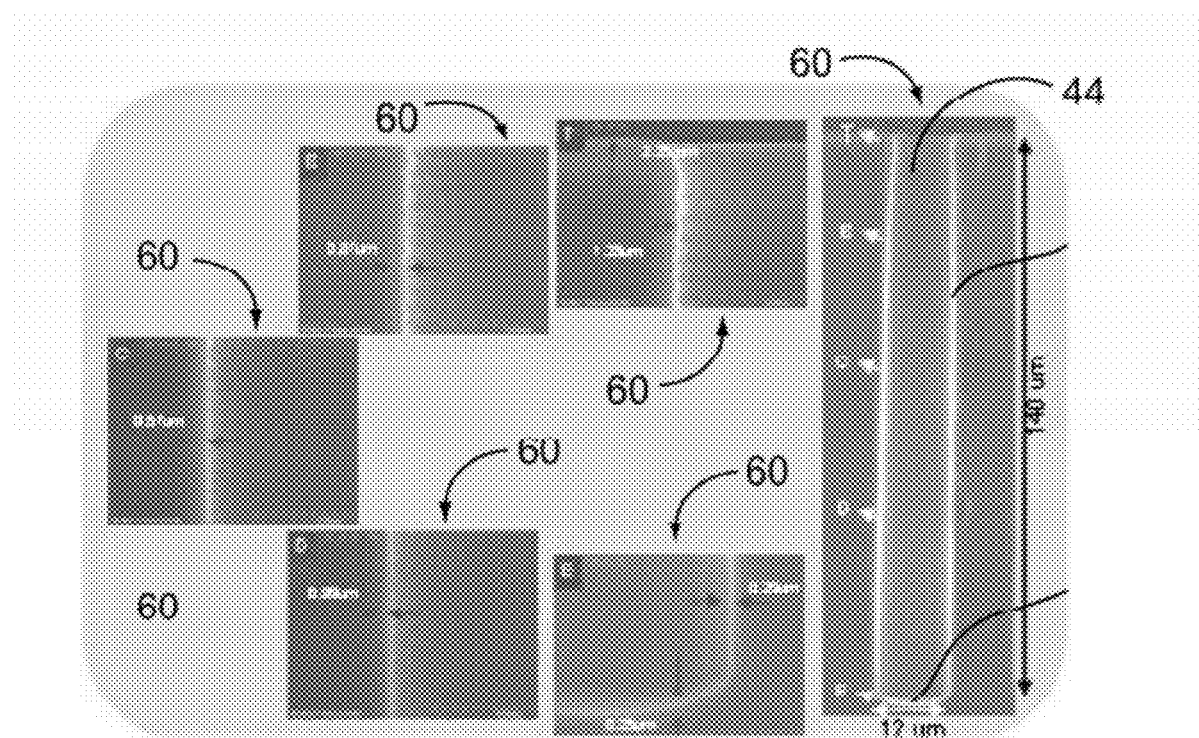
FIG. 5 shows SEM micrographs of cross-sections of a TSV feature comprising a through hole having a high aspect ratio and which is etched in a silicon plate, and which has an oxide liner deposited on the sidewalls and bottom walls of the through hole.

FIG. 5 shows SEM micrographs of the cross-section of a number of different through-silicon vias (TSV) 60 comprising a high aspect ratio through hole 44 etched through a silicon plate 20, and having an oxide liner 45 deposited on their sidewalls 48 and bottom walls 49 of the through holes 44. As seen, the oxide liner 45 provided good coverage of the bottom wall 40 and sidewalls 44 of the though holes 44 even for high aspect ratio holes. These through holes 44 had an aspect ratio of at least about 10:1, for example, from about 12:1 to about 14:1. The resultant TSVs 60 had diameters of from about 10 to about 12 microns and a height of about 140 microns. In this application, the oxide liner 45 was deposited on the sidewalls 48 and bottom walls 49 of the through holes 44 to electrical isolate metallic conductor which is subsequently deposited inside the TSVs 60, from the surrounding silicon material of the silicon plate 20. The oxide liner 45, in these examples, was deposited to an estimated thickness of about 2.5 microns, and the measured thickness from the SEM photos was found to be from about 2.3 microns to about 2.7 microns. Thus the deposited oxide liner 45 had good sidewall and bottom wall coverage with a thickness variation of less than 5%. The oxide liner 45 also demonstrated a relatively high breakdown voltage of at least about 9 MV/cm for example, about 10.2 MV/cm. Still further, the oxide liner 45 was later found to have good adherence to the metallic conductor 68 deposited over the oxide liner 45.

The low temperature oxide deposition process also provided good results for the TSVs 60. For example, the oxide liner 45 demonstrated surprisingly good moisture stability in ambient room temperature conditions, as shown in FIGS. 5A and 5B. In this experiment, oxide liner 45 was deposited into through holes 44 at a deposition temperature of 250° C. in two different thicknesses, namely thick at about 2 microns, and thin at about 0.5 microns. The thick and thin oxide liner layers were scrapped off and analyzed with Fourier-transformed Infrared (FTIR) spectroscopy, after 1 day and 10 days of exposure to the environment. FIGS. 5A and 5B show the FTIR graphs of the oxide liner material after 10 days of exposure to the environment. The ratio of the area of the —OH to Si—O—Si curve represents the amount of absorption of water vapor of the deposited oxide liner material. The FTIR results after 1 day and 10 days of exposure are shown in Table I:

TABLE I

Ratio of the Area of the —OH and Si—O—Si Peaks in FTIR spectra

| Process | Day 1 | Day 10 | Delta |
|---|---|---|---|
| Thick Oxide liner | 2.00 | 2.31 | 0.31 |
| Thin Oxide Liner | 1.88 | 2.27 | 0.39 |

From Table I, delta, which represents the change in the amount of water vapor absorbed into the oxide liner material from 1 day to 10 days of exposure is seen to be only 0.3% or 0.4% for the thick and thin oxide liners respectively. This represents less that a 0.5% change in the ratio of the —OH FTIR peak to the Si—O—Si FTIR peak over a 10 day period. This means that the oxide liner material deposited using the current low temperature process is stable over time and does not absorb a large amount of water from the atmosphere. In contrast, conventional oxide deposition processes provide less resistance to moisture resistance. These results were surprisingly good because oxides typically exhibit less film stability under ambient air conditions.

In another version, the oxide liner 45 comprises a conformal oxide liner deposited using TEOS. Advantageously, the conformal oxide liner deposits with higher thicknesses on the exposed surfaces 46 of the silicon plate 20 as compared to the sidewalls 48 and bottom wall 49 of the through holes 44 etched in the silicon plate 20, as shown in FIG. 1 In this process, oxide liner 45 is deposited with a low temperature plasma enhanced chemical vapor deposition process in a deposition zone 30a of a deposition chamber 34a. In this process, a deposition gas 40a comprising a silicon-containing precursor comprising tetraethylorthosilane (TEOS), and an oxygen precursor comprising oxygen gas ($O_2$), is introduced into the deposition zone 30a containing the substrate 18. In one version, the TEOS precursor is transported by a carrier gas such as helium, and provided in a mass flow rate of from about 500 mgm (mg/minute) to about 12000 mgm, for example about 3000 mgm. The deposition gas 40a is provided at a flow rate of from about 2000 to about 17,000 sccm, for example about 12,000 sccm. The gas pressure in the deposition zone 30a is maintained at a pressure of from about 2 Torr to about 8 Torr, for example about 5.5 Torr. During the deposition process, the substrate 18 is maintained at a temperature of less than about 250° C., for example, from about 100° C. to about 250° C. The substrate 18 is held at a spacing from a gas distributor 36a of from about 5 mm (200 mils) to about 13 mm (500 mils). The plasma is maintained by applying a current at a frequency of 13.6 MHz to process electrodes 38a1,b1 at a power level of from about 200 watts to about 1500 watts, for example about 1000 watts. In addition, the plasma can be enhanced by also applying to the process electrodes 38a1,b1, a low-frequency power at a frequency of from about 350 kHz. The low-frequency power can be applied at a power level of from about 10 watts to about 500 watts. The resultant plasma deposits an oxide liner 45 having a density of from about 2 $g/cm^3$ to about 3 $g/cm^3$, for example about 2.2 $g/cm^3$ In one version, the oxide liner 45 is deposited to a thickness of from about 1 microns to about 2 microns, or even from about 2 microns to about 6 microns.

Conformal Oxide Cap for TSV Via

When a low temperature oxide layer is deposited in a high aspect ratio through hole 44 using TEOS at low temperatures in a PECVD process, the resultant oxide layer can have poor conformality to the underlying structure due to the high aspect ratio of the through holes 44. For example, through holes 44 having aspect ratios of at least about 10 can generate non-conformal coatings inside the through holes 44. This problem is exacerbated when the critical dimension (CD) size of the through holes 44 is also small, for example, a CD of less than about 5 microns. In such high aspect ratio, small CD, through holes 44, a thicker PECVD deposited oxide layer with a thickness of at least about 1000 angstroms is deposited at the bottom walls 49 of the through holes 44. Further, the oxide overhang at the top edges and corners of the through holes 44 which are adjacent to the surface 46, can result in poor step coverage during subsequent PVD deposition steps due to lack of line of sight deposition, and also can result in voids during deposition of a conductor or metal material into the through holes 44. For these reasons, a more conformal oxide layer is desirable for high aspect ratio through holes 44. The conformal oxide layer can be deposited by a thermal CVD based process to provide a coating that is at least about 50% conformal, even on the sidewalls 48 and bottom wall 49 of the high aspect ratio through holes 44. However, disadvantageously, the oxide thickness of the conformal oxide layer at the top surface 46 of the substrate 18 is generally lower than the thickness of a low temperature PECVD oxide layer. The etch rate of the subsequent etching processes to etch away the conformal oxide layer at the bottom wall 49 of the through holes 44 faster than the top surface 46 due to lack of available radicals at the bottom of the holes 44. Thus, during the open etch of the oxide layer, both the conformal oxide layer on the top surface 46 and the low temperature passivation silicon nitride layer can become etched away, which is undesirable.

In one version, this problem is addressed by depositing a capping layer comprising a non-conformal silicon oxide or silicon nitride layer on top of a conformal low temperature silicon oxide layer, both the cap and underlying layer covering the top surface 46 of the substrate. The thickness of the capping layer comprising non-conformal silicon oxide layer can be varied according to the etch rate of the open surface area of the oxide layer on the top surface 46 of the substrate 18. The silicon nitride passivation layer 26 is deposited in a PECVD chamber at temperatures less than about 200° C., as described above. Thereafter, a non-conformal, low temperature, oxide layer is deposited in the through holes 44 using TEOS at low temperatures in a PECVD process.

After that, the substrate 18 is transferred to a deposition zone 30a of a deposition chamber 34a to deposit a capping layer comprising silicon oxide. In this process, a deposition gas 40a comprising a silicon-containing precursor comprising tetraethylorthosilane (TEOS), an oxygen precursor comprising oxygen gas ($O_2$), is introduced into the deposition zone 30a containing the substrate 18. In one version, the TEOS precursor is transported by a carrier gas such as helium, and provided in a mass flow rate of from about 100 mgm (mg/minute) to about 4000 mgm, for example about 400 mgm. The helium flow rate can from about 2500 to about 8000 sccm, for example about 9000 sccm. The oxygen is provided at a flow rate of from about 2500 to about 8500 sccm, for example, about 8000 sccm. The gas pressure in the deposition zone 30a is maintained at a pressure of from about 3 Torr to about 6 Torr, for example about 3.5 Torr. During the deposition process, the substrate 18 is maintained at a temperature of less than about 250° C., for example, from about 100° C. to about 200° C., for example, about 180° C. The substrate 18 is held at a spacing from a gas distributor 36a of from about 6.4 mm (250 mils) to about 13 mm (500 mils). The plasma is maintained by applying a current at a frequency of 13.6 MHz to process electrodes 38a1,b1 at a power level of from about 100 watts to about 1200 watts, for example about 350 watts. In addition, the plasma can be enhanced by also applying to the process electrodes 38a1,b1, a low-frequency power at a frequency of from about 350 kHz, and a power level of from about 0 watts to about 400 watts, for example, about 150 watts.

Figure 4D:
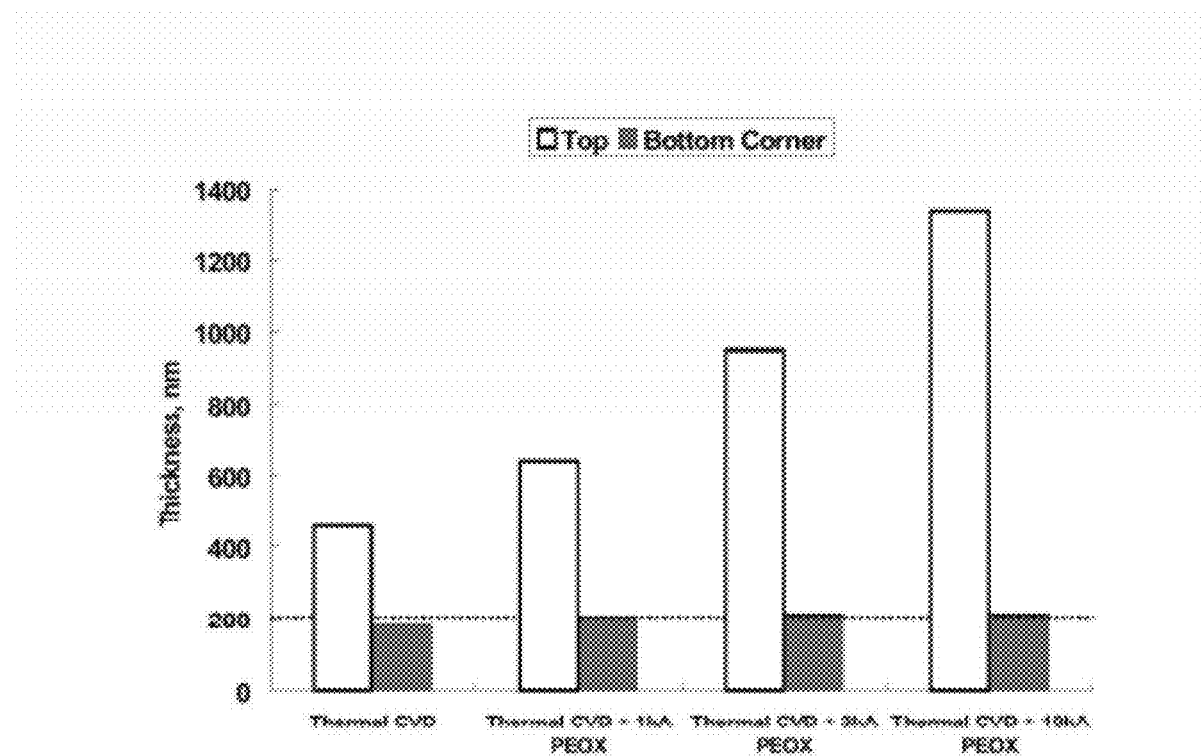
FIG. 4D is a graph showing the thickness of the layer deposited on the top substrate surface and the bottom of the TSV vias in the substrate for different processes.

In another version, the substrate 18 is transferred to a deposition zone 30a of a deposition chamber 34a to deposit a capping layer comprising silicon nitride. In this process, the substrate 18 is again transferred to a deposition zone 30a of a deposition chamber 34a. A deposition gas 40a comprising a silicon-containing precursor comprising silane ($SiH_4$) and a nitrogen-containing gas comprising ammonia ($NH_3$), is introduced into the deposition zone 30a containing the substrate 18. In one version, the silane is provided in a flow rate of from about 10 sccm to about 1000 mgm, for example about 100 sccm. The ammonia is provided at a flow rate of from about 100 to about 6,000 sccm, for example, about 450 sccm. In addition, nitrogen can be provided at a flow rate of from about 1000 to about 10,000 sccm, for example, about 10,000 sccm The gas pressure in the deposition zone 30a is maintained at a pressure of from about 1 Torr to about 6 Torr, for example about 3.5 Torr. During the deposition process, the substrate 18 is maintained at a temperature of less than about 250° C., for example, from about 100° C. to about 200° C., for example, about 180° C. The substrate 18 is held at a spacing from a gas distributor 36a of from about 5 mm (200 mils) to about 13 mm (500 mils). The plasma is maintained by applying a current at a frequency of 13.6 MHz to process electrodes 38a1,b1 at a power level of from about 10 watts to about 100 watts, for example, about 75 watts. In still another version, an oxide cap comprising a PECVD low temperature oxide layer is deposited on top of the passivation silicon nitride layer before the etching the through holes 44 in the silicon plate 20. FIG. 4D is a graph showing the thickness of the layer deposited on the top surface 46 or at the bottom walls 49 of the through holes 44 in the substrate 18 for different processes.

Sealing Layer Over Oxide Liner

Optionally, after deposition of the oxide liner 45, a sealing layer 64 of silicon dioxide or silicon nitride, can be deposited over the oxide liner 45 to seal off the oxide liner 45, as shown in FIG. 1H. The sealing layer 64 is denser than the underlying oxide liner 45, for example having a density of from about 2 g/cm$^3$ to about 3 g/cm$^3$, which is at least about 50% higher than the density of the oxide liner 45. The sealing layer 64 should also act as an excellent moisture barrier. A suitable sealing layer 64 can be made from silicon oxide deposited using a conventional PECVD process such as using tetraethylorthosilane, oxygen, and a helium dilutant. In this process, the process conditions include a process gas flow of 3000 mgm TEOS, 5500 sccm oxygen, and 6000 sccm He. The chamber is maintained at a gas pressure of from about 2 to about 8 Torr, for example about 5.5 Torr. During the deposition process, the substrate 18 is maintained at a temperature of from about 100° C. to about 220° C., for example, about 180° C. A plasma is formed by applying a current at a power level of from about 200 watts to about 1500 watts to the chamber electrodes. The resultant plasma deposits a sealing layer 64 comprising silicon oxide having a density of from about 2 g/cm$^3$ to about 3 g/cm$^3$, for example, from about 2.1 g/cm$^3$ to about 2.5 g/cm$^3$.

Another embodiment of a sealing layer 64 can be made from silicon nitride deposited in a low temperature process to provide a conformal silicon nitride layer that covers the oxide layer. This sealing layer 64 is useful when the oxide liner 45 is relatively thin and allows atomic metal species to diffuse through the oxide liner 45. The sealing layer 64 provides a diffusion barrier that prevents diffusion of metallic species, such as metal atoms, through the composite layer defined by the oxide liner 45 and the sealing layer 64. For example, a sealing layer 64 comprising silicon nitride can be deposited by plasma enhanced chemical vapor deposition. A suitable process gas comprises of $SiH_4$, $NH_3$, and $N_2$. The components of the process gas can be provided in the following flow ranges of about 10,000 sccm to about 30,000 sccm. The volumetric flow ratio of $SiH_4$ to $N_2$ is at least about 1:10. The chamber pressure should be of from about 2 to about 8 Torr, for example about 3.5 Torr. During the deposition process the substrate 18 is maintained at a temperature of from about 100° C. to about 200° C., for example about 180° C. The plasma is maintained by applying a current at a power level of from about 500 watts to about 1600 watts to the chamber electrodes. The resultant plasma deposits an nitride layer having a density of from about 2 g/cm$^3$ to about 3 g/cm$^3$, for example about 2.2 g/cm$^3$.

In still another version, the sealing layer 64 is deposited to a sufficient thickness to accommodate chemical mechanical polishing of the surface of the silicon plate 20. A sufficient thickness for the silicon layer 64 comprises from about 1 micron to about 6 microns. In the tank or sealing layer 64 can also be used to prevent excessive etching of the surface 46 of the silicon plate 20 during subsequent etching processes as described below.

After deposition of the oxide liner 45 and optionally sealing layer 64, a reactive ion etching (RIE) process is used to etch away the oxide liner 45 formed on the bottom walls 49 of the through holes 44, as per FIG. 2. In this process, the substrate 18 is placed in an etching chamber 52, similar to the one previously described and shown in FIG. 1E, or a different etching chamber, and a conventional oxide etching process is used to etch away the oxide liner 45 formed on the bottom walls 49 of the through holes 44 without excessively etching away the oxide liner 45 on the sidewalls 48 of the through holes 44. It is desirable to remove the oxide liner 45 on the bottom walls 49 of the through holes 44 to allow metallic conductor which is subsequently deposited into the through holes 44 to form an electrical contact with the underlying features. However, the oxide liner 45 should be retained on the sidewalls 48 to prevent the diffusion of metal-containing species through the sidewalls 49 into the silicon plate 20 or the diffusion of silicon-containing species in the other direction.

In one example of an oxide etching process, a plasma of an oxide etchant gas 80, such as a fluorine-containing gas, is formed in the etching zone 50 of the etching chamber 52 to etch away the silicon dioxide layer 28 on the bottom walls 41 of the through holes 44. The reactive ion etching process preferentially etches away the oxide liner 45 on the flat surfaces facing the impinging ions, such as the oxide liner 45 on the surface 46 of the second plate 20 as well as the oxide liner 45 on the bottom walls of the through holes 44, as compared to the oxide liner 45 on the sidewalls 48 of the through holes 44. In one embodiment, the etching gas comprises fluorine-containing gases such as $SF_6$, $CF_4$, $NF_6$, $C_4F_8$, $CHF_3$ and others, and a diluent gas such as argon. In one version, the silicon dioxide layer 28 on the bottom walls 41 of the through holes 44 is etched away with an etching gas comprising $SF_6$ at a volumetric flow rate of from about 20 to about 1000 sccm, or even for example, from about 50 to about 400 sccm, or even from about 100 to about 200 sccm; $C_4F_8$ at a flow rate of from about 20 to about 1000, or even from about 50 to about 400 sccm, or even from about 100 to about 200 sccm; and argon at a flow rate of from about 50 to about 500 sccm, or even for example from about 100 sccm to 300 sccm. The etching gas can also contain by itself, or in addition to the gases listed above, $CHF_3$ in a flow rate of from about 50 to about 1000 sccm, or even from about 150 to about 300 sccm; and $CF_4$ in a flow rate of from about 50 to about 2000 sccm, or even from about 200 to about 400 sccm. The etching gas 54 is maintained at a pressure of from about 1 mTorr to about 500 mTorr, or even from about 10 to about 100 mTorr, for example from about 20 to about 40 mTorr. The plasma is sustained by applying a current at a frequency of 13.6 MHz to process electrodes 56a,b about the process zone 50, at a power level of from about 200 watts to about 4000 watts, for example, from about 300 watts to about 1000 watts. In addition, the plasma can be enhanced by also applying power to an antenna at a power level of from about 1000 watts to about 3000 watts.

Thereafter, a metallic conductor 68 is deposited into the through holes 44 as per FIG. 2. The metallic conductor can include one or more layers of metals, elemental metals or their alloys, metal compounds, or even seed layers. In this process, a metallic conductor 68 is deposited into the though holes 44 to fill the holes and form the conductive TSVs 60. The metallic conductor 68 can be an elemental metal, metal alloys, metal compound, or mixtures thereof. The metallic conductor 68 is deposited into the through holes 44 to fill up the holes with an electrical conductor that serves as interconnects to connect two or more layers of active or passive features on the present silicon plates 20 with as well as other silicon plates (not shown). Suitable metallic conductors 47 include aluminum, copper, gold, titanium, tungsten, and alloys and compounds thereof.

In one embodiment, the metallic conductor 68 includes a metal barrier layer which is deposited prior to deposition of the bulk of the metallic conductor 68. The metal barrier layer (not shown) comprises a layer of an electrically conductive material that serves as a barrier to diffusion of metal or silicon species through the barrier layer. A suitable barrier layer comprises, for example, titanium, tantalum, or titanium nitride, which can be deposited by conventional CVD or physical vapor deposition process (PVD) processes. In one version, a sputtering target 72 comprising the desire composition of titanium is suspended in a sputtering chamber 74, as shown in FIG. 1I, and the substrate 18 is placed on a support 76 in a sputtering zone 77 in the chamber. A sputtering gas 78 comprising argon in a volumetric flow rate of from about 1 sccm to about 100 sccm, or even from about 4 sccm to about 25 sccm or even about 11 sccm, is introduced into the chamber 74. The chamber pressure is maintained at from about 0.2 mTorr to about 2 mTorr, for example about 2 mTorr. During the sputtering process, the substrate 18 is maintained at a temperature of from about room temperature to less than 100° C., for example about 50° C. The plasma is maintained by applying a current at a power level of from about 10 KW to about 100 KW, or even from about 30 KW to about 40 KW, to bias the sputtering target 72 and support 76 relative to one another. The resultant plasma deposits a metal barrier layer, which is typically deposited to a thickness of from about 100 angstroms to about 1 microns, or even from about 1000 to about 4000 angstroms.

After deposition of the barrier layer, the metallic conductor 68 can be deposited by first depositing a seed layer (also not shown), and then electroplating a bulk electroplated metal into the through holes 44. The seed layer is used to seed or initiate deposition of the bulk metallic conductor during the subsequent electroplating or other metal deposition processes. In one embodiment, a suitable seed layer comprises a layer of aluminum or copper deposited by a PVD process such as sputtering. In one embodiment, the seed layer comprises a copper layer deposited by a PVD process such as sputtering. In one version, a sputtering target 72 comprising the desire composition of copper is suspended in a sputtering chamber 74, as shown in FIG. 1I, and the substrate 18 is placed on a support 76 in a sputtering zone 77 in the chamber. A sputtering gas 78 comprising argon in a volumetric flow rate of from about 2 to about 200 sccm, or even from about 4 sccm to about 25 sccm, for example, about 11 sccm is introduced into the chamber 74. The chamber pressure is maintained at of from about 0.1 to about 20 mTorr, or even from about 0.2 mTorr to about 2 mTorr, for example about 2 mTorr. During the sputtering process, the substrate 18 is maintained at a temperature of from about room temperature to about 100° C., for example about 50° C. The plasma is maintained by applying a current at a power level of from about 10 KW to about 200 KW, or even from about 30 KW to about 40 KW, to bias the sputtering target 72 and support 76 relative to one another. The resultant plasma deposits a seed layer of metallic conductor of copper into the through holes 44 of the silicon plate 20. The seed layer is typically deposited to a thickness of from about 2000 angstroms to about 2 microns.

After deposition of a seed layer, a conventional electroplating process can be used to deposit the bulk of the metallic conductor 68 into the through holes 44, as shown in FIG. 1J. The electroplated layer formed by this process is seeded by the previously deposited seed layer. In this process, the silicon plate 20 of the substrate 18 with the through holes 44 is suspended in an electroplating bath 80 and serves as a cathode electrode 82, and another electrode 84 is also suspended in the electroplating bath. The substrate 18 is charged, for example, as the cathode electrode 82, and the other electrode 84 can serve as an anode. The electroplating bath 80 comprises a solution of metal ions, which when activated by an electrical current passed through the electroplating bath by a power supply 86, causes metallic conductor 68 to deposit into the through holes 44. For example, a suitable electroplating bath 80 for depositing copper comprises cupric ions in a concentration of from about 30 to about 75 grams per liter in a solution comprising water an acid (such as sulfuric acid or methane sulfonic acid), and any additional additives required, such as organic additives (suppressor, accelerator, leveler) and chloride ions. The power supply 86 supplies an electrical current in a current density range of from about 0.1 mA/cm$^2$ to about 20 mA/cm$^2$ on the cathode by supplying an appropriate voltage to the electrodes 82, 84. The electroplating processes operated for a time sufficient to completely fill the vias, for example, from about 10 to about 120 minutes, and can result in an additional overburden layer of copper on the surface of the silicon wafer of between 0.1 micron and 10 micron. In another embodiment, a metallic conductor 68 comprising aluminum is deposited in the through holes 44 in a conventional electroplating process.

After the metallic conductor 68 is deposited in the through holes 44 of the silicon plate 20 to form the TSVs 60, the substrate 18 is flipped over and the excess metallic conductor 68 on the surface of the silicon plate 20 polished off by a chemical mechanical polishing (CMP) process as per FIG. 2, to expose the top portions of the metallic conductor 68 deposited into the through holes 44 of the silicon plate 20. In a suitable chemical mechanical polishing process, the surface of the silicon plate 20 is polished by a polishing pad 90 mounted on a circulating polisher 92. A polishing slurry 94 is supplied by a slurry dispenser 96 connected to a polishing slurry source 98. As the substrate 18 is isolated or rotated relative to the polishing pad 90, the excess metallic conductor on the surface 46 of the silicon plate 20 is polished off the substrate 18. A suitable polishing slurry 94 comprises a basic particles suspended in an aqueous or alcohol solution. The chemical mechanical polishing step is conducted until all of the metallic conductor 68 on the surface 46 is polished away. The polishing process can also be used to remove any residue of oxide liner 45, silicon nitride passivation layer 26, or other such materials which still remain on the surface 38 of the silicon plate 25. As a result, the top portions of the metallic conductor 47 are now exposed to serve as metallic contacts 90.

TSV Backside Via Reveal

After polishing, the substrate 18 is flipped over to expose the metallic contacts 90 of the metallic conductor 68 at the top of the through holes 44, as shown in FIG. 1M. On exposure to the environment, a native oxide film 91 can sometimes form on the surface of the exposed metallic contacts 90 of the metallic conductor 68 of the TSVs 60. For example, native oxide films 99 comprising copper oxide, can form on metallic conductors 68 such as copper; whereas native oxide films 99 comprising aluminum oxide can form on aluminum features. In these cases, a native oxide treatment process is used to treat the native oxide films 99 as per FIG. 2, to reduce or remove the film to form the metal or non-oxide metal compound and allow better electrical contact with other conductors and interconnects.

In one embodiment, an optional native oxide treatment process is used to treat and remove a native oxide film 91 that forms on the exposed metallic contacts 90 to convert the same to the original metallic element or metallic compound of the metallic conductor 68. For example, a copper oxide removal treatment step can be used for a metallic conductor 68 comprising copper, to reduce a copper oxide film formed on the copper to the metallic elemental copper. In an exemplary native oxide treatment process, the substrate 18 is maintained at a temperature of from about 100° C. to about 220° C. in a reducing zone 92 of a process chamber 93. A process gas 94 comprising (i) a reducing gas, such as ammonia ($NH_3$) or hydrogen ($H_2$), and (ii) a diluent gas such as nitrogen, is introduced into the reducing zone 92. In another embodiment, the reducing gas 94 comprises ammonia or hydrogen, in a volumetric flow rate of from about 100 to about 3000 sccm; and either no nitrogen, or nitrogen in a volumetric flow rate of from about 10,000 to about 20,000 sccm. A plasma is formed of the reducing gas 94 for a time period of from about 5 to about 40 seconds to treat the native oxide film 91 on the metallic conductor 68 of the TSV features 60 to remove substantially all the native oxide film by a reducing process. The plasma is generated by applying power at a primary frequency of from about 13.6 MHz to the process electrodes 96*a,b*, for example, at a power level of from about 150 to about 1200 watts. In addition, the plasma can be further enhanced by powering the process electrodes 96*a,b* at a secondary frequency of about 350 kHz, and, for example, at a power level of from about 100 to about 300 watts.

After removal of the native oxide film 91, a protective coating 97 comprising a second silicon nitride passivation layer is deposited on the exposed surface of the substrate 18 as per FIG. 2, to cover the top of the metallic conductor deposited in the through holes 44, as shown in FIG. 1O. Optionally, a silane soaking step can be used prior to deposition of the passivating silicon nitride layer per FIG. 2. In this step, a process gas 94 comprising a soaking gas comprising substantially only silane ($SiH_4$), or silane with a diluent gas, is introduced into the process zone 92. During the process, the substrate 18 is maintained at a spacing distance from a gas distributor 95, of from about 5 mm (about 200 mils) to about 16.5 mm (about 650 mils). The substrate 18 is also maintained at a temperature of from about 100° C. to about 220° C. In one embodiment, the soaking gas comprises silane in a volumetric flow rate of from about 100 to about 1000 sccm; and optionally, nitrogen at a flow rate of from about 10,000 to about 25,000 sccm. A plasma is formed from the process gas by applying a primary frequency power of at a frequency of 13.6 MHz to the electrodes 96*a,b*, and, for example, at a power level of from about 150 to about 1200 watts. In addition, the plasma can be further enhanced by powering the electrodes 96*a,b* at a secondary frequency of about 350 kHz, and for example, at a power level of from about 100 to about 300 watts. The plasma is formed for a time period of from about 5 to about 20 seconds to soak the exposed surface of the substrate 18 with the silane gas to form an adhesion layer on the substrate surface. In one embodiment, for example, when the silane soak step is used to soak exposed metallic conductor 68, such as for example copper, the silane soak enhances adhesion by the formation of a metal-Si or in this case Cu—Si bond along the Cu/SiN interface. The interface adhesion energy is a strong function of native oxide removal time, soaking time, and silane flow rate. Further, the protective coating 97 is deposited at low temperature plasma enhanced chemical vapor deposition process to avoid excessively high temperatures which cause thermal stresses in, and warping of, the silicon plate 20 and carrier 24. The protective coating 97 can also be a good diffusion barrier that prevents metal atoms from diffusing through this layer to contaminate other regions of the substrate 18. For example, when the metallic conductor 68 comprises a metal such as copper, the protective coating 97 is selected to prevent the diffusion of copper, and also to provide good breakdown voltage electrical isolation, and moisture resistance.

In another embodiment, the protective coating 97 comprises a tri-layer coating 98 comprising three different layers 98*a,b,c*, as shown in FIG. 1P. In one version, the tri-layer coating 98 comprises a lower layer 98*a* of silicon nitride which serves as a diffusion barrier to metal atoms from the metallic conductor in the TSV features 60, and can also serve chemical mechanical polishing stop layer at the top surface of the substrate 18. The lower layer 98*a* can have a thickness of from about 200 to about 1500 angstroms.

The lower layer 98*a* can be deposited on the cleaned and soaked surface of the substrate 18 in the process zone 92 of the chamber 93. In this process, the substrate 18 is maintained at a same spacing from the gas distributor of from about 8 mm (about 300 mils) to about 19 mm (about 750 mils). The substrate 18 is also maintained at a temperature of from about 100° C. to about 220° C., for example about 180° C. A process gas 94 comprising a silicon-containing gas, such as silane (SiH4), and a nitrogen-containing gas such as ammonia (NH3) is introduced into the chamber 100 through the gas distributor 95. A diluent gas which assists in the formation in the plasma, and which can also stabilize the plasma may also be added to the process gas, suitable diluent gases including nitrogen ($N_2$), helium (He), and argon (Ar). In one embodiment, the process gas 94 comprises silane at a flow rate of from about 50 to about 1000 sccm, for example about 650 sccm; ammonia is provided in a flow rate of from about 100 sccm to about 1000 sccm; and a diluent gas such as nitrogen at a flow rate of from about 500 to about 25,000 sccm, for example about 22,000 sccm. The chamber pressure is maintained at from about 2 Torr to about 5.5 Torr, for example, about 3.5 Torr. The plasma is maintained by applying a current at a frequency of 13.6 MHz to the process electrodes 96*a,b*, at a power level of from about 500 watts to about 1600 watts, for example about 1100 watts. In addition, the plasma can be enhanced by also applying a low-frequency power at a frequency of about 350 kHz; and at a power level of from about 10 watts to about 200 watts. The resultant plasma deposits a lower layer 98*a* consisting of silicon nitride layer having a density of from about 2 $g/cm^3$ to about 3 $g/cm^3$, for example about 2.2 $g/cm^3$.

After deposition of the lower layer 98*a*, a middle layer 98*b* composed of silicon oxide is deposited. The middle layer 98*b* has a high breakdown voltage, for example, a breakdown voltage of at greater than about 4 MV/cm, or even about 5 MV/cm. The middle layer 98*b* also has good step coverage, for example, a step coverage of at least about 10% to cover TSV vias 60 having different heights, for example, heights that can range from about 1 micron to about 20 micron, on the same substrate 18. In one embodiment, the middle layer 98*b* has a thickness of from about 0.5 microns to about 3 microns.

In one embodiment, a middle layer 98*b* comprising silicon oxide was deposited using a process gas 94 comprising (i) a silicon-containing gas comprising silane ($SiH_4$) and tetraethylorthosilane (TEOS), (ii) an oxygen-containing gas comprising oxygen ($O_2$) or nitrous oxide ($N_2O$); and a diluent gas, such as helium (He) or argon (Ar). The substrate 18 is maintained at a spacing of from about 5 mm (about 200 mils) to about 16.5 mm (about 650 mils), and at a temperature of from about 100° C. to about 220° C., for example about 180° C. In one version, the process gas 94 comprises tetraethylorthosilane at a mass flow rate of from about 500 to about 12,000 mgm; silane at a volumetric flow rate of from about 50 to about 1000 sccm, for example about 500 sccm; nitrous oxide at a flow rate of from about 1000 sccm to about 15,000 sccm; oxygen at a flow rate of from about 2000 sccm to about 17,000 sccm; and helium at a flow rate of from about 1000 to about 15,000 sccm. The chamber pressure is maintained at from about 2 Torr to about 7 Torr, for example, about 2.4 Torr. A plasma is formed by applying a current at a frequency of 13.6 MHz to the process electrodes 96a,b, at a power level of from about 200 watts to about 1500 watts, for example about 650 watts; and optionally, applying a low-frequency power at a frequency of 350 kHz and a power level of from about 50 to about 500 watts, for example about 150 watts. The resultant plasma deposits a middle layer 98b of silicon oxide having a density of from about 2 g/cm³ to about 3 g/cm³, for example about 2.2 g/cm³.

Thereafter, an upper layer 98c comprising silicon nitride is formed on the substrate 18 to complete the tri-layer coating 98. The upper layer 98c can serve as a moisture barrier layer as well as a chemical mechanical polishing stop layer. The upper layer 98c also provides good stability, a hermetic seal, and low wet etch rate ratio to oxide, which allows easier CMP polishing. The upper layer 98c also provided particularly good compatibility in the CMP polishing for a metallic conductor comprising copper. In one embodiment, the upper layer 98c has a thickness of from about 0.5 microns to about 3 microns. Also, the upper layer 98c can be deposited to have a higher density, for example a density of at least about 2 g/cm³, or from about 2 g/cm³ to about 3 g/cm³ g/cm³.

An upper layer 98c of silicon nitride layer can be deposited using a process gas comprising SiH4, NH3, and N2, which is for example, provided in the following volumetric flow rates 1.4:1:40. During the deposition process, the substrate 18 is maintained at a temperature of from about 100° C. to about 220° C., for example, about 180° C. The chamber pressure is maintained at from about 2 to about 8 Torr, for example, about 3.5 Torr. The plasma is maintained by applying a current at a power level of from about 500 watts to about 1600 watts to the chamber electrodes. The substrate 18 is maintained at a spacing of from about 5.1 mm (200 mils) to about 16.5 mm (650 mils), and at a temperature of from about 100° C. to about 220° C., for example about 180° C. In one version, the process gas 94 comprises tetraethylorthosilane at a mass flow rate of from about 500 to about 12,000 mgm; silane at a volumetric flow rate of from about 50 to about 1000 sccm, for example about 650 sccm; nitrous oxide at a flow rate of from about 1000 sccm to about 15,000 sccm; oxygen at a flow rate of from about 2000 sccm to about 17,000 sccm; and helium at a flow rate of from about 1000 to about 15,000 sccm. The chamber pressure is maintained at from about 2 Torr to about 7 Torr. A plasma is formed by applying a current at a frequency of 13.6 MHz to the process electrodes 96a,b, at a power level of from about 200 watts to about 1500 watts; and optionally, applying a low-frequency power at power level of from about 50 to about 500 watts. The resultant plasma deposits an upper layer 98c of silicon nitride having a density of from about 2 g/cm³ to about 3 g/cm³, for example about 2.2 g/cm³.

Instead of the tri-layer scheme, the protective coating 98 can also comprise a sufficient thickness of a single layer of silicon oxide or silicon nitride. The single layer is deposited using either of the processes described above, but which are simply operated for a longer time to get a higher deposition thickness. For example, a single layer of silicon dioxide can be deposited using the silicon oxide deposition process described above, operated for about 10 seconds to about 5 minutes, to get a thickness of from about 0.1 microns to about 6 microns. Similarly, a single layer of silicon nitride can be deposited using the silicon nitride deposition process described above, operated for 10 seconds to about 5 minutes, to get a thickness of from about 0.1 microns to about 6 microns.

In a third embodiment, the protective coating 98 comprises two layers, namely, a silicon nitride layer followed by deposition of silicon oxide layer. The second embodiment allows polishing or grinding off the entire silicon oxide layer and stopping the polishing or grinding process at the silicon nitride layer. For example, a silicon nitride layer can be deposited for 10 seconds to about 5 minutes, to get a thickness of from about 0.1 microns to about 6 microns; and thereafter, a silicon dioxide layer can be deposited for about 10 seconds to about 5 minutes, to get a thickness of from about 0.1 microns to about 6 microns.

In a fourth embodiment, the protective coating 98 comprises a silicon oxide layer followed by deposition of a moisture barrier silicon nitride layer. Again, for example, a silicon dioxide layer can be deposited for about 10 seconds to about 5 minutes, to get a thickness of from about 0.1 microns to about 6 microns; and thereafter, a silicon nitride layer can be deposited for 10 seconds to about 5 minutes, to get a thickness of from about 0.1 microns to about 6 microns.

In still another version, a polyimide layer 99 deposited over the surface of the silicon plate 20 and a connector bump 116 extends through the polyimide layer 99 to contact the metallic conductor 68 of the underlying TSV 60 to form an electrical connection therewith. For example, the connector bump 116 can be formed of an elemental metal or alloys thereof, or metal compound or mixtures thereof, for example, an elemental metal such as copper. Generally, the connector bump 116 is formed from the same metallic conductor 68 as that used to form the TSV 60. Thereafter, a protective coating 97 is deposited over the polyimide layer 99 as well as the connector bump 116 for passivation of these surfaces and to provide a moisture barrier. A suitable protective coating 97 comprises silicon nitride deposited as described before.

After the TSV 60's are fabricated, the substrate 18 is debonded to separate the silicon plate 20 from the carrier 24 as per FIG. 2. In a typical debonding process, the final silicon plate 20 is removed from the carrier 24 using a thermo-mechanical activated slide-off technique. This technique uses a compliant chucking system to protect the features and topography formed on the back side of the substrate 18 while heating the substrate 18 to a temperature higher than the softening point of the bonding material. For debonding, the substrate 18 is fixed in an appropriate debonding module on both sides with a compliant vacuum chucking system (not shown) and uniformly heated. When debonding temperature is reached, the silicon plate 20 is slid apart from the carrier 24. The debonding module fully supports both the plate 20 and the carrier over their whole area to keep them flat and stress-free during the debonding procedure. After the plate 20 and carrier are separated, the thin silicon plate 20 with the TSV features on it is transferred to a single-wafer cleaning chamber, where remaining adhesive is removed from the backside of the plate 20 with an appropriate solvent.

Thereafter, the silicon plate 20 is cut using conventional die-cutting methods as per FIG. 2, to separate the individual electronic circuits that are formed on the silicon plate 20, such as integrated circuit chips, displays, solar cells, etc. The die cut electronic circuits are bonded to one another, or to other electronic circuits using conventional bonding methods, such as diffusion bonding to form a multilayer stack comprising a plurality of electronic circuits stacked in a vertical orientation.

Substrate Processing Chamber

Figure 7:
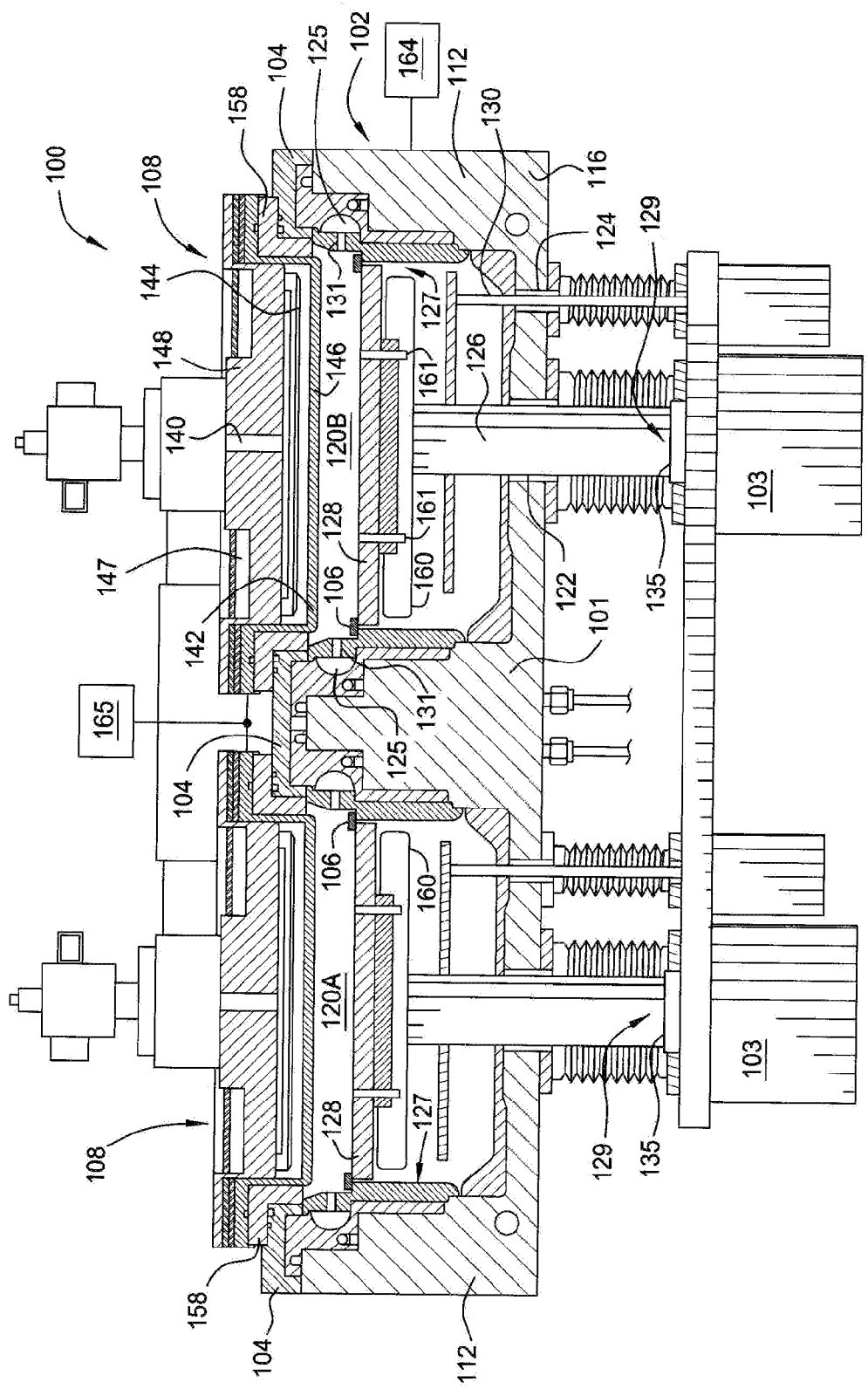
FIG. 7 is a schematic partial sectional view of an embodiment of a substrate processing chamber that is a plasma chamber which is suitable for treating the substrate and/or depositing various silicon dioxide, silicon nitride, or other layers onto the substrate.

The processes described herein, including for example, the various passivation and liner deposition processes, including the silicon nitride and silicon dioxide deposition processes shown in the flowchart of FIG. 2, can be performed in a substrate processing chamber 100, an illustrative exemplary embodiment of which is shown in FIG. 7. Some or all of the deposition processes described herein, and the pre-deposition processes such as cleaning native oxide and silane soaking can be implemented in this chamber; however, etching processes are typically implemented in conventional etching process chambers. The chamber 100 is provided to illustrate an exemplary chamber; however, other chambers may also be used, as would be apparent to one of ordinary skill in the art. Accordingly, the scope of the invention should not be limited to the exemplary chamber described herein. Generally, the chamber 100 is a plasma-enhanced chemical vapor deposition (PE-CVD) chamber suitable for processing a substrate 18 (such as a silicon wafer).

Examples of PECVD systems that may be adapted to benefit from the embodiments described herein include a PRODUCER® SE CVD system, a PRODUCER® GT™ CVD system or a DXZ®CVD system, all of which are commercially available from Applied Materials, Inc., Santa Clara, Calif. The Producer® SE CVD system (e.g., 200 mm or 300 mm) has two isolated process zones 102A,B that may be used to deposit layers on the substrates 18 (not shown in chamber), such as a silicon nitride layer, silicon oxide layer, or other layers including conductor films, carbon-doped silicon oxides and other materials and is described in U.S. Pat. Nos. 5,855,681 and 6,495,233, both of which are incorporated by reference. The DXZ® CVD chamber is disclosed in U.S. Pat. No. 6,364,954, which is also incorporated by reference. Although the exemplary embodiment includes two process zones, it is contemplated that the embodiments described herein may be used to advantage in systems having a single processing region or more than two process zones. It is also contemplated that the embodiments described herein may be utilized to advantage in other plasma chambers, including etch chambers, ion implantation chambers, plasma treatment chambers, and stripping chambers, among others. It is further contemplated that the embodiments described herein may be utilized to advantage in plasma processing chambers available from other manufacturers.

The substrate processing chamber 100 comprises a processing chamber body 102 having sidewalls 112, a bottom wall 116 and an interior sidewall 101 defining a pair of process zones 120A and 120B. Each of the process zones 120A-B is similarly configured, and for the sake of brevity, only components in the processing region 120B will be described.

The chamber 100 comprises a substrate support 128 having an active cooling system which allows for active control of the temperature of a substrate positioned on the substrate support 128 over a wide temperature range while the substrate is subjected to numerous process and chamber conditions. The substrate support 128 is disposed in the processing region 120B through a passage 122 formed in the bottom wall 116 in the system 100. The substrate support 128 is adapted to support a substrate (not shown) on the upper surface thereof. The substrate support 128 may include heating elements, for example resistive elements, to heat and control the substrate temperature at a desired process temperature. Alternatively, the substrate support 128 may be heated by a remote heating element, such as a lamp assembly.

The substrate support 128 is coupled by a shaft 126 to a power outlet or power box 103, which may include a drive system that controls the elevation and movement of the substrate support 128 within the processing region 120B. The shaft 126 also contains electrical power interfaces to provide electrical power to the substrate support 128. The power box 103 also includes interfaces for electrical power and temperature indicators, such as a thermocouple interface. The shaft 126 also includes a base assembly 129 adapted to detachably couple to the power box 103. A circumferential ring 135 is shown above the power box 103. In one embodiment, the circumferential ring 135 is a shoulder adapted as a mechanical stop or land configured to provide a mechanical interface between the base assembly 129 and the upper surface of the power box 103. A rod 130 is disposed through a passage 124 formed in the bottom wall 116 and is utilized to activate substrate lift pins 161 disposed through the substrate support 128. The substrate lift pins 161 selectively space the substrate from the substrate support 128 to facilitate exchange of the substrate with a robot (not shown) utilized for transferring the substrate into and out of the processing region 120B through a substrate transfer port 160.

The substrate support 128 of the chamber 100 allows for active temperature control of a substrate 18 during processing at all times over a complete process cycle. Certain embodiments described herein provide low temperature control to temperatures of less 400° C., or even less than 250° C.; while other embodiments provide higher temperature control at temperatures upwards of 400° C. using an embedded heating element with a minimal temperature gradient (<10° C.) with unique element patterns. Certain embodiments described herein can remove larger thermal loads (e.g., upwards of 2,000 watts) from either an external source like RF coupling or an internal source such as the embeded heating element by flowing active coolant through body of the substrate support 128. Certain embodiments described herien provide a lower desired temperature gradient through the active control of the heater element together with the flow rate of the coolant through the body of the substrate support 128.

Certain embodiments described herein provide the ability to actively control the temperature of the substrate over a wide range while the substrate is subjected to numerous processes and chamber conditions (e.g. heater faceplate, coupling RF struck in chamber, process gases, chemistry, etc.) Active temperature control may be achieved through two active temperature fluxes; first, heat is provided to the substrate support 128 via a brazed/embedded heating element, and second, heat is removed from the substrate support 128 via an internal coolant path. Thus the temperature of the substrate support 128 surface (which the substrate rests on) can be controlled to a desired temperature set point by controlling the level of these two fluxes. Increased heat can be generated by delivering more power to the heating element and reducing the flow rate of the coolant (or reducing the coolant inlet temperature), or the reverse can be done to achieve a cooler substrate support temperature. The wider temperature control range is achieved through controlling the interactions between the heat sources (internal from the heating element or external from the chamber or process conditions) and the heat drain (internal active coolant). In one embodiment, this is achieved by positioning the heating element in the support body closer to the support surrface where the substrate 18 rests to maximize the highest temperature that can be achieved and by positioning the cooling channel in the lower body of the shaft at a height to drain out the desired amount of heat.

Certain embodiments described herein further provide the ability to control temperature uniformity within 10° C. over the range of the temperature controlled. In one embodiment, this may be achieved by positioning the heating element relative to the cooling channel as described above, and also utilizing an air gap positioned between the heating element and the cooling channel to further control the path of heat flow. In one embodiment, the placement of the cooling channel, air gap, and heating element yields a maximum planar deflection of the support surface of no greater than 5 thousandth of an inch which reduces the likelihood of the substrate 18 sliding during processing.

In one embodiment, the substrate support 128 comprises an aluminum alloy. In one embodiment, the aluminum alloy is an aluminum alloy containing magnesium and silicon such as Aluminum 6061. The Aluminum alloy provides three important features: 1) high thermal conductivity which contributes to the interaction of heat flow from heat source to the coolant, 2) capacity to be handled by various machining techniques (e.g. brazing the shaft assembly to incorporate cooling channels at an intermediate height, bead-blasting the support surface to increase radiative heat loss, nickel plating the coating channel to be able to flow hard water, and 3) lower cost to produce.

A chamber lid 104 is coupled to a top portion of the chamber body 102. The lid 104 accommodates one or more gas distribution systems 108 coupled thereto. The gas distribution system 108 includes a gas inlet passage 140 which delivers reactant and cleaning gases through a showerhead assembly 142 into the processing region 1208. The showerhead assembly 142 includes an annular base plate 148 having a blocker plate 144 disposed intermediate to a faceplate 146. A radio frequency (RF) source 165 is coupled to the showerhead assembly 142. The RF source 165 powers the showerhead assembly 142 to facilitate generation of plasma between the faceplate 146 of the showerhead assembly 142 and the heated substrate support 128. In one embodiment, the RF source 165 may be a primary frequency radio frequency (HFRF) power source, such as a 13.56 MHz RF generator. In another embodiment, RF source 165 may include a HFRF power source and a secondary frequency radio frequency (LFRF) power source, such as a 300 kHz RF generator. Alternatively, the RF source may be coupled to other portions of the processing chamber body 102, such as the substrate support 128, to facilitate plasma generation. A dielectric isolator 158 is disposed between the lid 104 and showerhead assembly 142 to prevent conducting RF power to the lid 104. A shadow ring 106 may be disposed on the periphery of the substrate support 128 that engages the substrate at a desired elevation of the substrate support 128.

Optionally, a cooling channel 147 is formed in the annular base plate 148 of the gas distribution system 108 to cool the annular base plate 148 during operation. A heat transfer fluid, such as water, ethylene glycol, a gas, or the like, may be circulated through the cooling channel 147 such that the base plate 148 is maintained at a predefined temperature.

A chamber liner assembly 127 is disposed within the processing region 1206 in very close proximity to the sidewalls 101, 112 of the chamber body 102 to prevent exposure of the sidewalls 101, 112 to the processing environment within the processing region 1206. The liner assembly 127 includes a circumferential pumping cavity 125 that is coupled to a pumping system 164 configured to exhaust gases and byproducts from the processing region 1206 and control the pressure within the processing region 1206. A plurality of exhaust ports 131 may be formed on the chamber liner assembly 127. The exhaust ports 131 are configured to allow the flow of gases from the processing region 1206 to the circumferential pumping cavity 125 in a manner that promotes processing within the system 100.

Figure 8A:
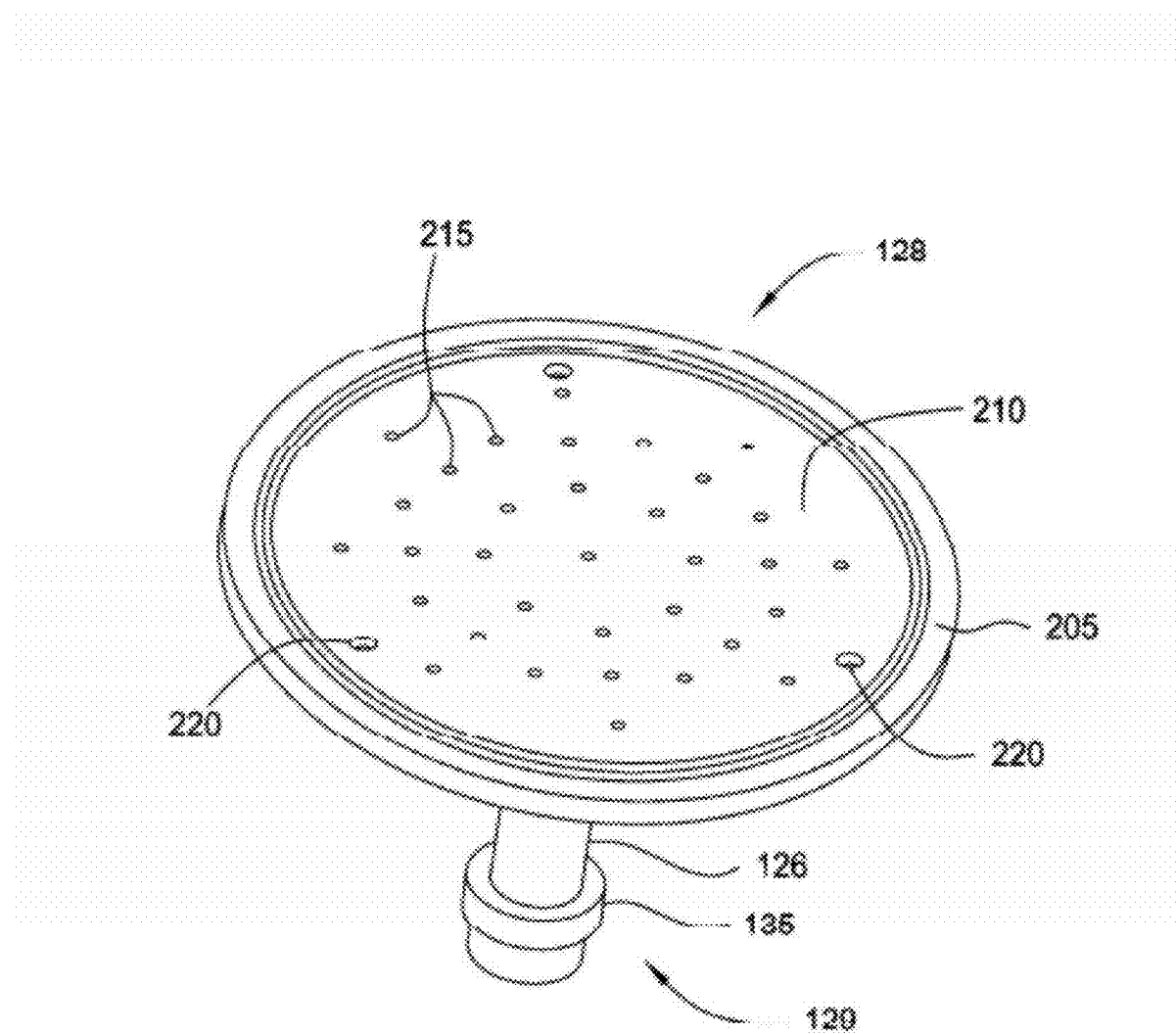
FIG. 8A is an isometric side view of one embodiment of the substrate support shown in FIG. 7.

FIG. 8A is an isometric top view of one embodiment of a substrate support 128 that is utilized in the substrate processing chamber 100. The substrate support 128 includes a shaft 126 and a base assembly 129 opposite a circular substrate support 128. In one embodiment, the shaft 126 is configured as a tubular member or hollow shaft. In one embodiment, the base assembly 129 is utilized as a detachable mating interface with electrical connections disposed in or on the power outlet or power box 103. The substrate support 128 includes a peripheral ledge 205 that surrounds the substrate receiving support surface 210 that is substantially planar. The support surface 210 may be adapted to support a 200 mm substrate, a 300 mm substrate, or a 450 mm substrate. In one embodiment, the support surface 210 includes a plurality of structures 215, which may be bumps or protrusions extending above the plane of the support surface 210. The height of each of the plurality of structures 215 are substantially equal to provide a substantially planar substrate receiving plane or surface that is slightly elevated or spaced-away from the support surface 210. In one embodiment, each of the structures 215 are formed of or coated with a material that is different from the material of the support surface 210. The substrate support 128 also includes a plurality of openings 220 formed therethrough that are adapted to receive a lift pin 161 (FIG. 7).

In one embodiment, the body of the substrate support 128 and shaft 126 are made of a conductive metallic material while the base assembly 129 is made of a combination of a conductive metallic material and an insulative material. Fabricating the substrate support 128 from a conductive metallic material lowers the cost of ownership as compared to substrate support 128s made of ceramics. Additionally, the conductive metallic material serves to shield an embedded heater (not shown in this view) from RF power. This increases the efficiency and lifetime of the substrate support 128, which decreases cost of ownership.

In one embodiment, the body of the substrate support 128 and shaft 126 are made solely of an aluminum material, such as an aluminum alloy. In a specific embodiment, both of the substrate support 128 and shaft are made of 6061 Aluminum. In one embodiment, the base assembly 129 comprises aluminum portions and insulative portions, such as a polyetheretherketone (PEEK) resin disposed therein to electrically insulate portions of the base assembly 129 from the conductive portions of the substrate support 128 and shaft 126. In one embodiment, the body of the substrate support 128 is made from an aluminum material while each of the structures 215 disposed on the support surface 210 are made of or coated with a ceramic material, such as aluminum oxide.

In one embodiment, the support surface 210 of the substrate support 128 is textured. The support surface 210 may be textured using techniques known in the art, for example, bead blasting, an etch-back process, or combinations thereof. In one embodiment, the root mean square ("RMS") roughness of the textured support surface 210 of the substrate support 128 may be from about 0.75 microns to about 6 microns, for example, between about 1.5 microns and about 5 microns, for example about 2 microns.

Figure 8B:
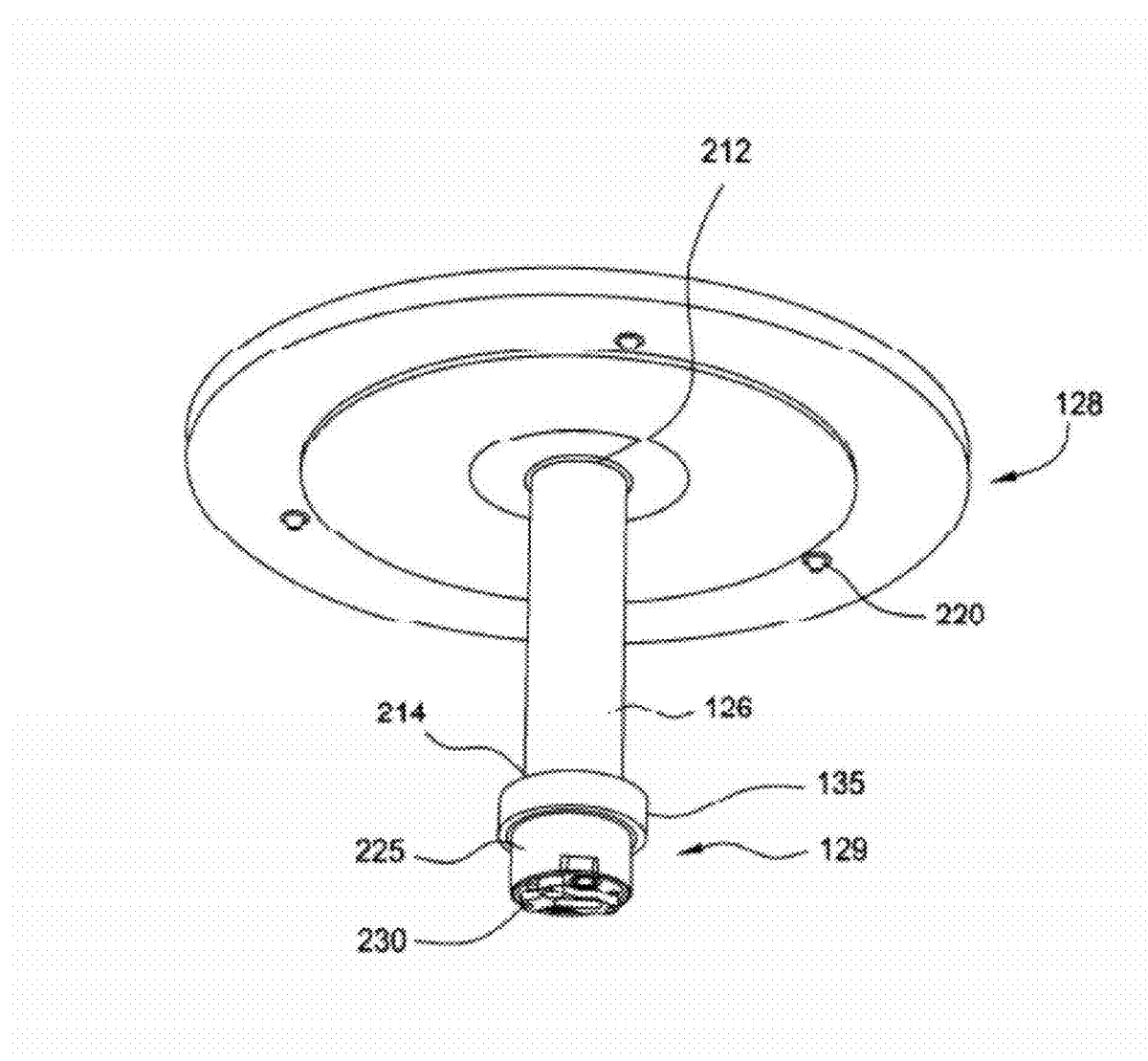
FIG. 8B is an isometric bottom view of one embodiment of the substrate support shown in FIG. 7.

FIG. 8B is an isometric bottom view of one embodiment of a substrate support 128. The shaft 126 includes a first end 212 that is coupled to the substrate support 128 and a second end 214 coupled to a base assembly 129 opposite the substrate support 128. In this embodiment, the base assembly 129 includes a slotted conductive portion 225 that is coupled to and/or containing a dielectric plug 230. In one embodiment, the slotted conductive portion 225 may be configured as a plug or a male interface adapted to mate with the power box 103 (FIG. 7). In the embodiment depicted in FIG. 8B, the conductive portion 225 may be circular in cross-section having slots formed at least partially through an outer surface or wall. The dielectric plug 230 may be configured as a socket or a female interface or, alternatively, comprising a portion or portions that are configured as a socket or female interface adapted to receive or mate with electrical connections within the power box 103. In one embodiment, the slotted conductive portion 225 may be an integral extension of the shaft 126 and made of an aluminum material, while the dielectric plug 230 is made of a PEEK resin.

The base assembly 129 also includes the circumferential ring 135 adapted to receive an o-ring 240 that interfaces with the power box 103 depicted in FIG. 7. In this embodiment, the slotted conductive portion 225 includes an opening adapted to receive the dielectric plug 230 and the dielectric plug 230 fastens to the slotted conductive portion 225. The dielectric plug 230 also includes openings or sockets formed therein to receive electrical leads from the power box 103.

Figure 9A:
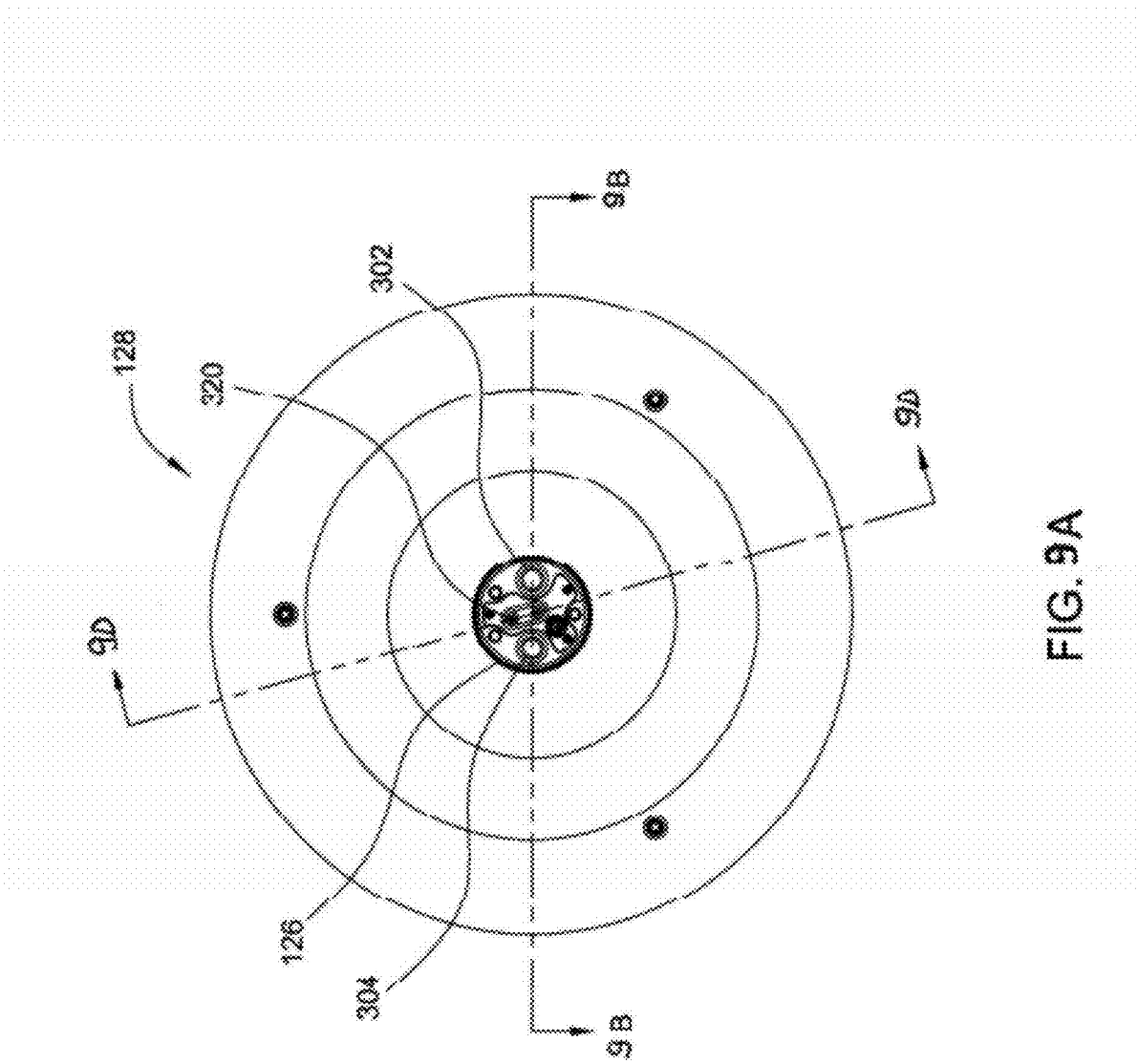
FIG. 9A is a bottom schematic view of one embodiment of the substrate support shown in FIG. 7.

FIG. 9A is a bottom schematic view of one embodiment of a substrate support 128. The dielectric plug 230 has a cooling channel inlet 302 for delivering a coolant to a cooling channel, a cooling channel outlet 304 for removing coolant from the cooling channel, and a conductive plug 320.

FIG. 9B is a cross-sectional side view taken along lines 9B-9B of FIG. 9A of one embodiment of a substrate support 128 having an active cooling system. FIG. 9C is an enlarged cross-sectional view of one embodiment of the substrate support 128 of FIG. 9B. In one embodiment, the active cooling system comprises a resistive heater assembly 305, a cooling channel assembly 306, and a heat control gap 308. The resistive heater 305 is disposed or encapsulated in a conductive body 300 of the substrate support 128. In one embodiment, the conductive body 300 is made of a material consisting of a conductive metal, such as aluminum.

The cooling channel assembly 306 has a cooling channel 307, a cooling channel inlet 302, a cooling channel outlet 304, and a fluid recirculator 309 for supplying a heat transfer fluid or "coolant" to the cooling channel assembly. In one embodiment, the cooling channel 307 is a ring-shaped channel positioned in the body of the shaft 126 encircling the hollow portion of the shaft 126. With reference to FIG. 9E, the cooling channel 307 is defined by an upper wall 350, an opposing lower wall 352, an inner peripheral wall 354, and an outer peripheral wall 356. In one embodiment, the cooling channel 307 is a continuous ring which encircles the diameter of the hollow portion of the shaft 126. In certain embodiments, the cooling channel 307 is a partial ring which only encircles a portion of the hollow portion of the shaft 126.

In one embodiment, the cooling channel inlet 302 is a longitudinal channel extending through the shaft 126 of the substrate support 128 assembly 128. A first end of the cooling channel inlet 302 is coupled with fluid recirculator 309 and a second end of the cooling channel inlet 302 is fluidly coupled with the cooling channel 307. In one embodiment, the cooling channel outlet 304 is a longitudinal channel extending through the shaft 126 of the substrate support 128 assembly 128. A first end of the cooling channel outlet 304 is coupled with the cooling channel 307 and a second end of the cooling channel outlet is coupled with the fluid recirculator 309.

In operation the heat transfer fluid may be reused and continuously pumped through the cooling channel assembly 306 by the fluid recirculator 309. In certain embodiments, the heat transfer fluid may be heated or cooled to a pre-selected temperature by the fluid recirculator 309 prior to entering the cooling channel inlet 302. For example, the fluid recirculator 309 may comprise a pump (not shown) to pump the heat transfer fluid through the cooling channel assembly 306, a cooler or heater (also not shown) to cool or heat the heat transfer fluid, and a thermostat (also not shown) to monitor the temperature of the heat transfer fluid and control the cooler or heater to maintain the temperature at a desired level. The fluid recirculator 309 may also comprise pressure gauges for monitoring fluid pressure, gauges, valves for controlling the flow, and other components for controlling the flow of heat transfer fluid which are not described for the sake of brevity. In operation, the heat transfer fluid is supplied to the cooling channel inlet 302 of the cooling channel assembly 306. The heat transfer fluid is pumped into the cooling channel inlet 302, flows through the cooling channel 306 to heat or cool the conductive body 300 of the substrate support 128 (depending on the relative temperatures of the heat transfer fluid and the substrate support 128), and is removed or exhausted from the cooling channel outlet 304.

In one embodiment, the heat transfer fluid may comprise water, ethylene glycol, a gas, or the like. In one embodiment, the heat transfer fluid comprises a mixture of water and ethylene glycol, for example, a mixture of 50% water and 50% ethylene glycol. In certain embodiments, a separate storage vessel may be coupled with the cooling channel outlet 304 to store used coolant. As shown in FIG. 9D, the cooling channel inlet 302 and the cooling channel outlet 304 are isolated from the power leads 315a, 315b by the body of the shaft 126.

In one embodiment, the heat control gap 308 is positioned in the conductive body 300 of the substrate support 128 encircling the hollow portion of the shaft 126 to further control the path of heat flow. The flow of heat transfer fluid through the shaft 126 of the substrate support 128 creates a localized cold spot at the center of the support surface 210, the heat control gap 308 increases the thermal resistance around the center of the support surface 210 of the substrate support 128 thereby acting as a cold spreader. With reference to FIG. 9C, the heat control gap 308 is formed by an upper wall 312, an opposing lower wall 313, and a peripheral wall 314 which surrounds the heat control gap 308. In one embodiment, the peripheral wall 314 is circular thus giving the heat control gap 308 a circular shape. The heat control gap 308 may also have any other shapes which provide for the desired amount of heat control for the active cooling system. For example, the heat control gap 308 may have a shape selected from other shapes such as ovals, squares, rectangles, and non-uniform shapes. In one embodiment, the heat control gap 308 has a diameter between about 2 inches (5.1 cm) and about six inches (15.2 cm). In one embodiment, the heat control gap 308 has a diameter between about 3 inches (7.6 cm) and about 4 inches (10.2 cm). The diameter of the heat control gap 308 may be varied in order to provide the desired amount of heat control. The distance between the upper wall and the lower wall (e.g. the height) of the heat control gap 308 may also be varied in order to provide the desired amount of heat control. In one embodiment, the height of the heat control gap 308 is between about 0.1 inches (0.3 cm) and about 1 inch (2.5 cm). In another embodiment, the height of the heat control gap 308 is between about 0.4 inches (1 cm) and about 0.5 inches (1.3 cm).

In one embodiment, a top surface of the resistive heater 305 is positioned between about 0.10 inches (0.3 cm) and about 0.80 inches (2 cm) from the support surface 210 of the substrate support 128. In another embodiment, a top surface of the resistive heater 305 is positioned between about 0.15 inches (0.4 cm) and about 0.20 inches (0.5 cm) from the support surface 210 of the substrate support 128. In one embodiment, the upper wall 312 of the heat control gap 308 is positioned between about 0.5 inches (1.3 cm) and about 1.5 inches (3.8 cm) from the support surface 210 of the substrate support 128. In another embodiment, the upper wall of the heat control gap 308 is positioned between about 0.9 inches (2.3 cm) and about 1.2 inches (3.0 cm) from the support surface 210 of the substrate support 128. In one embodiment, an upper wall 350 of the cooling channel 307 is positioned between about 3 inches (7.6 cm) and about 5 inches (12.7 cm) from the support surface 210 of the substrate support 128. In another embodiment, the upper wall 350 of the cooling channel 307 is positioned between about 4 inches (10.2 cm) and about 4.5 inches (11.4 cm) from the support surface 210 of the substrate support 128.

In one embodiment, the cooling channel 307 is positioned at a distance "X" from the resistive heating element 305. In one embodiment, the upper wall 312 of the heat control gap 308 is positioned a distance "Y" from the bottom surface of the resistive heater 305. In one embodiment, the lower wall 313 of the heat control gap 308 is positioned at a distance "Z" from the cooling channel 307. In one embodiment, the distances "X", "Y", and "Z" are selected to drain the desired amount of heat from the substrate support 128.

FIG. 9D is a cross-sectional side view taken along line 9D-9D of FIG. 9A of one embodiment of a substrate support 128 having an active cooling system described herein. As shown in FIG. 9B, the shaft 126 is coupled to a power outlet or power box 103 as shown in FIG. 7. The resistive heater 305 is coupled to a power source 310 disposed in the power box 103 by conductive leads 315a, 315b disposed in the shaft 126. The shaft 126 also includes a longitudinal channel or hole 350 adapted to receive a thermocouple (not shown). In this embodiment, the dielectric plug 230 includes one or more conductive plugs 320 disposed therein to couple the conductive leads 315 with one or more respective sockets 326a, 326b disposed in the power box 103. In one embodiment, the conductive plugs 320 are multi-contact plugs. The conductive leads 315 and the conductive plugs 320 may be electrically biased during operation, but are electrically isolated from the slotted conductive portion 225, the shaft 126, and substrate support 128 by a peripheral wall 325 of the dielectric plug 230.

In one embodiment, the shaft 126 and substrate support 128 are made of aluminum and are electrically grounded. The aluminum material encapsulates the heating element and acts an effective RF shield for the resistive heater 305. The RF shielding by the aluminum material eliminates need for band pass filters to filter off RF coupling to the resistive heater 305, which may be needed in heated substrate support 128s made of different materials, such as ceramic. The design of the electrical interface using conductive plugs 320 as power terminals for the resistive heater 305 enables standard gauge wires and connectors from the power box 103 to be used as opposed to custom designed electrical connectors. The conductive plugs 320 are mounted on a unique base design comprising a PEEK resin. The conductive plugs 320 comprise a power terminal assembly, which is mechanically supported by the dielectric plug 230 which fastens onto the conductive portion 225 of the base assembly 129. The PEEK resin electrically insulates the live power terminals (conductive plugs 320) against the grounded heater body (substrate support 128 and shaft 126). Thus, the substrate support 128 minimizes costs by the elimination of band-pass filters and utilizes less-expensive aluminum material, which significantly reduces cost of ownership. Further, the substrate support 128 as described herein may be retrofitted to replace original substrate support 128s in existing chambers without extensive redesign and/or downtime.

Figure 10:
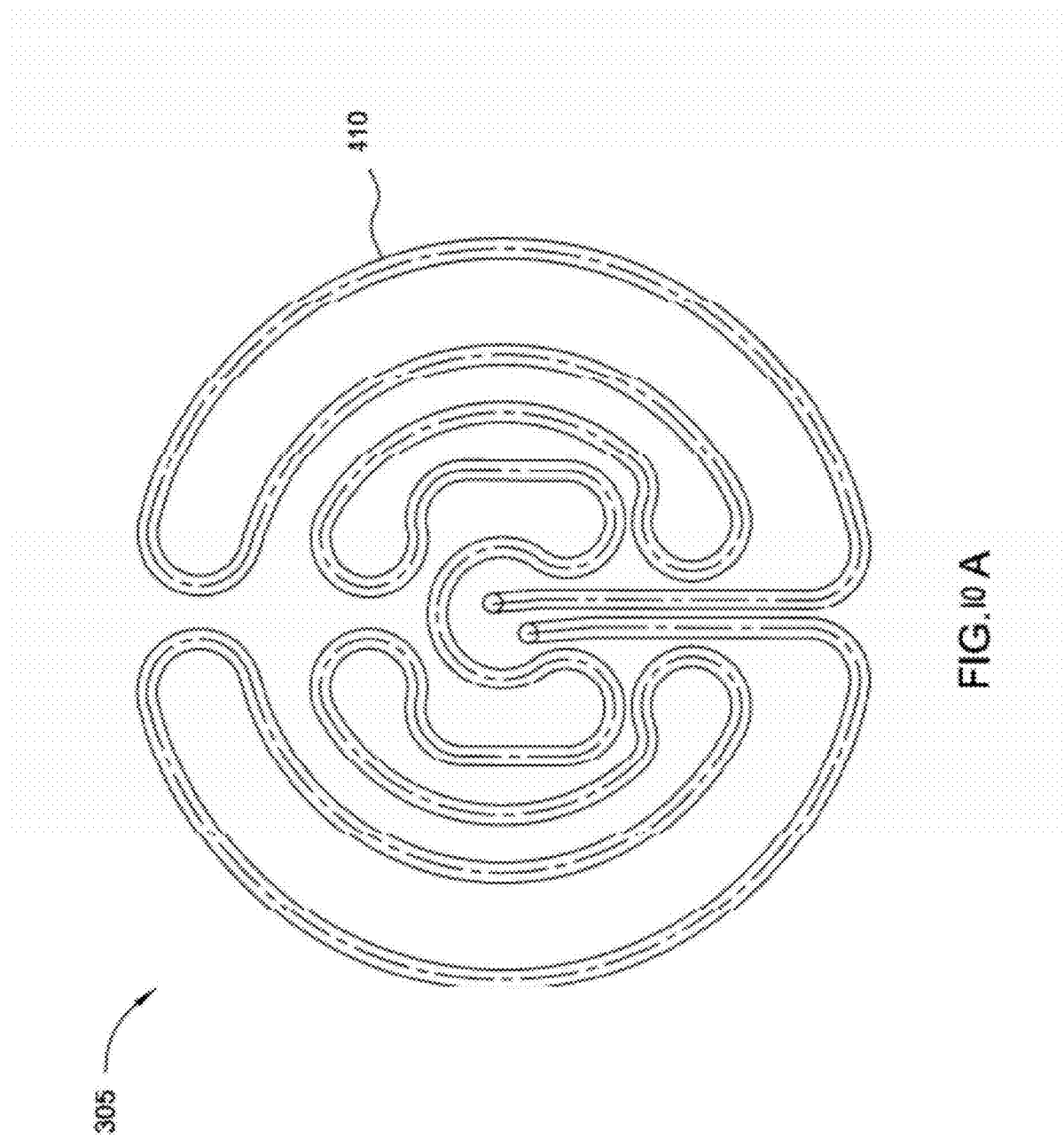
FIG. 10A is a schematic top view of an embodiment of a resistive heater.
FIG. 10B is a schematic side view of an embodiment of a resistive heater.

FIG. 10A is a schematic top view of one embodiment of a resistive heater 305. FIG. 10B is a schematic side view of one embodiment of the resistive heater 305. In one embodiment, the resistive heater 305 comprises a heating element 410. As shown in FIG. 10A, the heating element 410 is patterned to provide a center dense pattern in the center portion of the resistive heater 305 to provide a radiant heating profile that matches and compensates for substrate thermal loss. For example, with reference to FIG. 9D, the heating element 410 can be spaced closer together toward the center of the conductive support body 300 compared to the edges of the conductive support body 300. The flow of coolant through the shaft 126 creates a cold spot in the center of the support surface 210 relative to the edges of the support surface 210. Although shown as center dense, it should be understood that the heating element 410 may be adapted to encompass any variation in substrate loss heat profile. For example, the heating element 410 may be adapted to provide a variable amount of heat output by varying their size, spacing, resistivity, input power, or the like to more closely match the substrate loss profile.

Table I summarizes a thermal and structural modeling simulation of a substrate support 128 using the active cooling system describe herein. The Inlet Temp [° C.] represents the inlet temperatures of the heat transfer fluid as the fluid enters the cooling channel assembly. The Outlet Temp [° C.] represents the outlet temperature of the heat transfer fluid as it exits the active cooling assembly. The Volume Flow Rate [GPM] represents the gallons per minute of coolant flowing through the cooling channel assembly. The Temp Set Point [° C.] represents the set point temperature of the resistive heater. The Temp Gradient [° C.] represents the temperature difference between the high temperature and the low temperature on the support surface of a substrate support 128 using the active cooling system described herein. The Max Deform [mil] represents the maximum planar deflection of the substrate support 128. Deflection has two modes, first, the support surface and conductive body of the substrate support 128 may warp, second, the shaft of the substrate support 128 may tilt due to the temperature change between inner fluid and outer fluid. The Max Deformation Results indicate that the embodiments depicted herein can yield a maximum planar deflection of the support surface of no greater than five thousandth of an inch (5 mils).

TABLE 1

Results for thermal and structural modeling of substrate support 128.

| Inlet Temp. [° C.] | Outlet Temp. [° C.] | Volume Flow Rate [GPM] | Temp. Set Point [° C.] | RF Coupling Power | Power In [W] | Temp. Gradient [° C.] | Max Deform. [mil] |
|---|---|---|---|---|---|---|---|
| 25 | 26.4 | 1.5 | — | 430 | 0 | 7.18 | 1.86 |
| 25 | 26.6 | 1.5 | 180 | 430 | 196 | 7.91 | 2.45 |
| 25 | 41.8 | 0.1 | 400 | 0 | 1410 | 9.29 | 4.84 |

The chamber 100 and substrate support 128 described herein provide improved low temperature processing of a substrate by providing active temperature control throughout the process cycle. The substrate support 128 can also provide good temperature control at temperatures of less 400° C., or even less than 250° C.; while other embodiments provide higher temperature control at temperatures upwards of 400° C. For example, the substrate support 128 can remove larger thermal loads (e.g., upwards of 2,000 watts) from either an external source like RF coupling or an internal source such as the embedded heating element by flowing active coolant through body of the substrate support 128. The substrate support 128 also provides a lower temperature gradient through the active control of the heater element together with the flow rate of the coolant through the body of the substrate support 128. This allows the substrate support 128 the ability to actively control the temperature of the substrate over a wide range of process and plasma conditions while the substrate is subjected to numerous processes and chamber conditions (e.g. heater faceplate, coupling RF struck in chamber, process gases, chemistry, etc.) Active temperature control may be achieved through two active temperature fluxes; first, heat is provided to the substrate support 128 via a brazed/embedded heating element, and second, heat is removed from the substrate support 128 via an internal coolant path. Thus the temperature of the substrate support 128 surface (which the substrate rests on) can be controlled to a desired temperature set point by controlling the level of these two fluxs.

Although exemplary embodiments of the present invention are shown and described, those of ordinary skill in the art may devise other embodiments which incorporate the present invention and which are also within the scope of the present invention. Furthermore, the terms "below", "above", "bottom", "top", "up", "down", "first" and "second", and other relative or positional terms are shown with respect to the exemplary embodiments in the FIGS. and are interchangeable. Therefore, the appended claims should not be limited to the descriptions of the preferred versions, materials, or spatial arrangements described herein to illustrate the invention.

What is claimed is:

1. A through-silicon via fabrication method comprising:
   (a) etching a plurality of through holes in a silicon plate, the through holes each having a sidewall and a bottom wall;
   (b) depositing an oxide liner on the sidewall and bottom wall of each of the plurality of through holes by:
      (i) providing the silicon plate in a process zone comprising process electrodes and a gas distributor;
      (ii) maintaining the silicon plate at a temperature of less than about 250° C.;
      (iii) introducing into the process zone, a deposition gas comprising a silicon-containing gas comprising tetraethylorthosilane, and an oxygen precursor comprising oxygen gas; and
      (iv) energizing the deposition gas to form a plasma by applying a current to the process electrodes;
   (c) depositing a metallic conductor in the through holes;
   (d) after (c), removing a native oxide film formed on the exposed portions of the metallic conductor in the through holes by:
      (i) introducing into the process zone, a reducing gas comprising ammonia or hydrogen; and
      (ii) energizing the reducing gas to form a reducing plasma by applying a current to the process electrodes; and
   (e) depositing a protective coating comprising:
      (i) a lower layer comprising silicon nitride;
      (ii) a middle layer comprising silicon oxide; and
      (iii) an upper layer comprising silicon nitride.

2. A method according to claim 1 wherein (b) comprises maintaining the temperature is between about 100° C. and about 250° C.

3. A method according to claim 1 wherein (b) comprises at least one of:
   (1) introducing the tetraethylorthosilane at a mass flow rate between about 400 mg/minute and about 12,000 mg/minute; or
   (2) introducing the deposition gas in a volumetric flow rate between about 2000 sccm and about 17,000 sccm.

4. A method according to claim 1 wherein (b) comprises maintaining the deposition gas at a pressure between about 2 Torr and about 8 Torr.

5. A method according to claim 1 wherein (b) comprises forming the plasma by applying the current at a first frequency to the process electrodes at a first power level of from about 100 watts to about 1200 watts, and at a second frequency at a second power level of up to 400 watts.

6. A method according to claim 1 wherein after (b) and before (c), a sealing layer is deposited over the oxide liner, the sealing layer comprising silicon dioxide or silicon nitride.

7. A method according to claim 1 further comprising, after (c), flipping the substrate over and chemical mechanical polishing the back surface of the silicon plate to expose the top portions of the metallic conductor deposited into the through holes of the silicon plate.

8. A method according to claim 1 wherein (d) comprises
   (i) providing the silicon plate in the process zone;
   (ii) maintaining the silicon plate at a reducing temperature of from about 100° C. to about 220° C.;
   (iii) introducing the reducing gas at a volumetric flow rate of between about 100 and about 3000 sccm; and
   (iv) applying power to the process electrodes at a frequency of about 13.6 MHz, and at a power level of from about 150 to about 1200 watts.

9. A method according to claim 8 comprising adding nitrogen to the reducing gas at a volumetric flow rate of from about 1000 to about 20,000 sccm.

10. A method according to claim 8 comprising forming the reducing plasma for a time period of between about 5 and about 40 seconds.

11. A method according to claim 1 further comprising, after (d), a silane soaking step comprising:
   (i) providing the silicon plate in a soaking process zone comprising a pair of soaking process electrodes;
   (ii) maintaining the silicon plate at a soaking temperature between about 100° C. and about 220° C.;
   (iii) introducing into the soaking process zone, a soaking gas comprising silane with a volumetric flow rate of from about 100 to about 1000 sccm; and
   (iv) energizing the soaking gas to form a soaking plasma by applying power to the process electrodes at a frequency of about 13.6 MHz, and at a power level of between about 150 and about 1200 watts.

12. A method according to claim 11 wherein the soaking gas further comprises nitrogen at a volumetric flow rate of between about 1000 and about 25,000 sccm.

13. A method according to claim 11 comprising forming the soaking plasma for a time period of between about 5 and about 20 seconds.

14. A method according to claim 1 wherein in (e):
   (1) the lower layer comprises a thickness of from about 200 Å to about 1500 Å;
   (2) the middle layer comprises a thickness of from about 0.5 microns to about 3 microns; and
   (3) the upper layer comprises a thickness of from about 0.5 microns to about 3 microns.

15. A method according to claim 1 further comprising depositing a silicon nitride passivation layer on an exposed back surface of the silicon plate of the substrate.

16. A through-silicon via fabrication method comprising:
   (a) etching a plurality of through holes in a silicon plate, the through holes each having (i) an aspect ratio of at least about 10:1, (ii) a sidewall, and (iii) a bottom wall;
   (b) depositing an oxide liner on the sidewall and bottom wall of each of the plurality of through holes by:
      (i) providing the silicon plate in a process zone comprising process electrodes and a gas distributor;
      (ii) maintaining the silicon plate at a temperature of less than about 250° C.;
      (iii) introducing into the process zone, a deposition gas comprising a silicon-containing gas comprising tetraethylorthosilane, and an oxygen precursor comprising oxygen gas; and
      (iv) energizing the deposition gas to form a plasma by applying a current to the process electrodes;

(c) depositing a metallic conductor in the through holes; and (d) removing a native oxide film formed on the exposed portions of the metallic conductor in the through holes by energizing a reducing gas to form a plasma, the reducing gas comprising ammonia or hydrogen in a volumetric flow rate between about 100 and about 3000 sccm and nitrogen in a volumetric flow rate between about 10,000 and about 20,000 sccm.

17. A method according to claim 16 wherein (d) comprises forming the plasma for between about 5 and about 40 seconds.

18. A method according to claim 16 further comprising depositing a protective coating comprising:
(1) a lower layer comprising silicon nitride having a thickness of from about 200 Å to about 1500 Å;
(2) a middle layer comprising silicon oxide having a thickness of from about 0.5 microns to about 3 microns; and
(3) an upper layer comprising silicon nitride having a thickness of from about 0.5 microns to about 3 microns.

19. A through-silicon via fabrication method comprising:
(a) etching a plurality of through holes in a silicon plate, the through holes each having (i) an aspect ratio of at least about 10:1, (ii) a sidewall, and (iii) a bottom wall;
(b) depositing an oxide liner on sidewall and bottom wall of each of the plurality of through holes by:
(i) providing the silicon plate in a process zone comprising process electrodes and a gas distributor;
(ii) maintaining the silicon plate at a temperature of less than about 250° C.;
(iii) introducing into the process zone, a deposition gas comprising a silicon-containing gas comprising tetraethylorthosilane, and an oxygen precursor comprising oxygen gas; and
(iv) energizing the deposition gas to form a plasma by applying a current to the process electrodes;
(c) depositing a metallic conductor in the through holes; and
(d) after (c), a silane soaking step comprising:
(i) maintaining the substrate at a temperature of from about 100° C. to about 220° C.; and
(ii) energizing a soaking gas to form a plasma, the soaking gas comprising silane in a volumetric flow rate of between about 100 and about 1000 sccm.

20. A method according to claim 19 wherein the soaking gas comprises nitrogen at a flow rate between about 1000 and about 25,000 sccm.

21. A method according to claim 19 further comprising depositing a protective coating comprising:
(1) a lower layer comprising a silicon nitride layer having a thickness of from about 200 Å to about 1500 Å;
(2) a middle layer comprising silicon oxide having a thickness of from about 0.5 microns to about 3 microns; and
(3) an upper layer comprising silicon nitride having a thickness of from about 0.5 microns to about 3 microns.

22. A method according to claim 19 comprising depositing a protective coating comprising a silicon nitride layer and a silicon oxide layer.

23. A through-silicon via fabrication method comprising:
(a) etching a plurality of through holes in a silicon plate, each of the plurality of through holes comprising a sidewall and a bottom wall;
(b) depositing an oxide liner on the surface of the silicon plate and on the sidewall and bottom wall of each of the plurality of through holes by:
(i) providing the silicon plate in a process zone comprising process electrodes and a gas distributor;
(ii) maintaining the silicon plate at a temperature of less than about 250° C.;
(iii) introducing into the process zone, a deposition gas comprising a silicon-containing gas comprising tetraethylorthosilane, and an oxygen precursor comprising oxygen gas; and
(iv) energizing the deposition gas to form a plasma by applying a current to the process electrodes;
(c) depositing a metallic conductor in the through holes; and
(d) removing a native oxide film formed on the exposed portions of the metallic conductor in the through holes, by:
(i) providing the silicon plate in a reducing process zone comprising a pair of reducing process electrodes;
(ii) maintaining the silicon plate at a reducing temperature between about 100° C. to about 220° C.;
(iii) introducing into the reducing process zone, a reducing gas comprising ammonia or hydrogen at a volumetric flow rate of from about 100 to about 3000 sccm, and nitrogen gas at a volumetric flow rate of from about 1000 to about 20,000 sccm; and
(iv) applying power to the reducing process electrodes at a frequency of about 13.6 MHz, and at a power level of from about 150 to about 1200 watts.

24. A through-silicon via fabrication method comprising:
(a) etching a plurality of through holes in a silicon plate, each of the plurality of through holes comprising a sidewall and a bottom wall;
(b) depositing an oxide liner on the surface of the silicon plate and on the sidewall and bottom wall of each of the plurality of through holes by:
(i) providing the silicon plate in a process zone comprising process electrodes and a gas distributor;
(ii) maintaining the silicon plate at a temperature of less than about 250° C.;
(iii) introducing into the process zone, a deposition gas comprising a silicon-containing gas comprising tetraethylorthosilane, and an oxygen precursor comprising oxygen gas; and
(iv) energizing the deposition gas to form a plasma by applying a current to the process electrodes;
(c) depositing a metallic conductor in the through holes;
(d) removing a native oxide film formed on the exposed portions of the metallic conductor in the through holes, by:
(i) providing the silicon plate in a reducing process zone comprising a pair of reducing process electrodes;
(ii) maintaining the silicon plate at a reducing temperature between about 100° C. to about 220° C.;
(iii) introducing into the reducing process zone, a reducing gas comprising ammonia or hydrogen, at a volumetric flow rate of from about 100 to about 3000 sccm; and
(iv) applying power to the reducing process electrodes at a first frequency of about 13.6 MHz, and at a first power level of from about 150 to about 1200 watts; and
(e) after removal of the native oxide film:
(i) providing the substrate in a soaking process zone comprising a pair of soaking process electrodes;
(ii) maintaining the substrate at a soaking temperature between from about 100° C. and about 220° C.;
(iii) introducing into the soaking process zone, a soaking gas comprising silane with a volumetric flow rate of from about 100 to about 1000 sccm; and
(iv) applying power to the soaking process electrodes at a second frequency of about 13.6 MHz, and at a second power level of from about 150 to about 200 watts.

* * * * *

UNITED STATES PATENT AND TRADEMARK OFFICE
CERTIFICATE OF CORRECTION

PATENT NO. : 8,329,575 B2
APPLICATION NO. : 12/977060
DATED : December 11, 2012
INVENTOR(S) : Rajagopalan et al.

It is certified that error appears in the above-identified patent and that said Letters Patent is hereby corrected as shown below:

In the Specifications:

Column 22, line 11 "1208" should be changed to --120B--.

Column 22, line 52 "surrface" should be changed to --surface--.

Column 23, line 18 "1208" should be changed to --120B--.

Column 23, line 46 "1206" should be changed to --120B--.

Column 23, line 49 "1206" should be changed to --120B--.

Column 23, line 52 "1206" should be changed to --120B--.

Column 23, line 53 "1206" should be changed to --120B--.

Column 23, line 56 "1206" should be changed to --120B--.

Signed and Sealed this
Fourteenth Day of May, 2013

Teresa Stanek Rea
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,329,575 B2 | |
| APPLICATION NO. | : 12/977060 | |
| DATED | : December 11, 2012 | |
| INVENTOR(S) | : Rajagopalan et al. | |

It is certified that error appears in the above-identified patent and that said Letters Patent is hereby corrected as shown below:

In the Specification

Column 3, line 32 "thick (FIG.5A) and thin (FIG.5B)" should be changed to --thick (FIG.6A) and thin (FIG.6B)--.

Column 10, line 3 "sidewalls 44" should be changed to --sidewalls 48--.

Column 10, line 10 "to electrical isolate" should be changed to --to electrically isolate--.

Figure 6A:
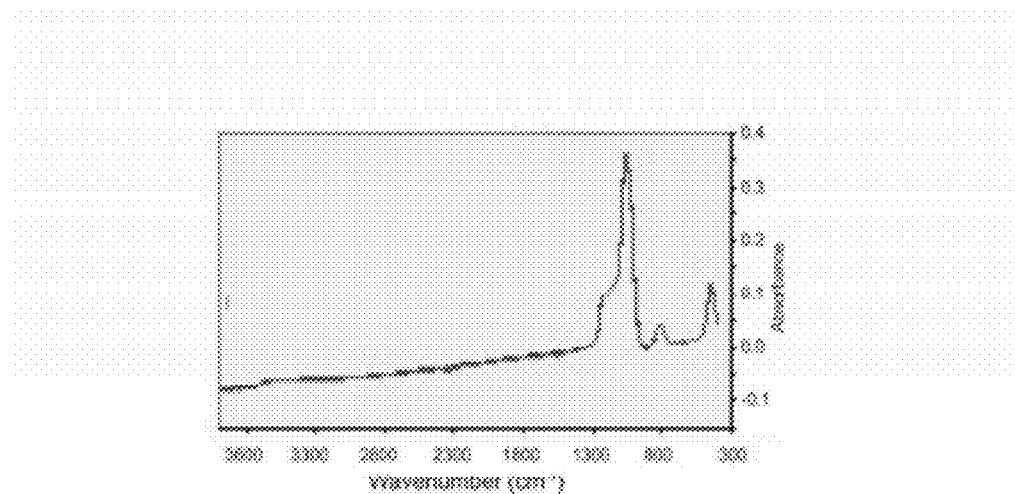
FIGS. 6A and 6B are graphs showing Fourier-transformed Infrared (FTIR) spectroscopy traces of the oxide liner material deposited on the sidewalls and bottom walls of the through holes for thick (FIG. 5A) and thin (FIG. 5B) oxide liner deposits.
Figure 6B:
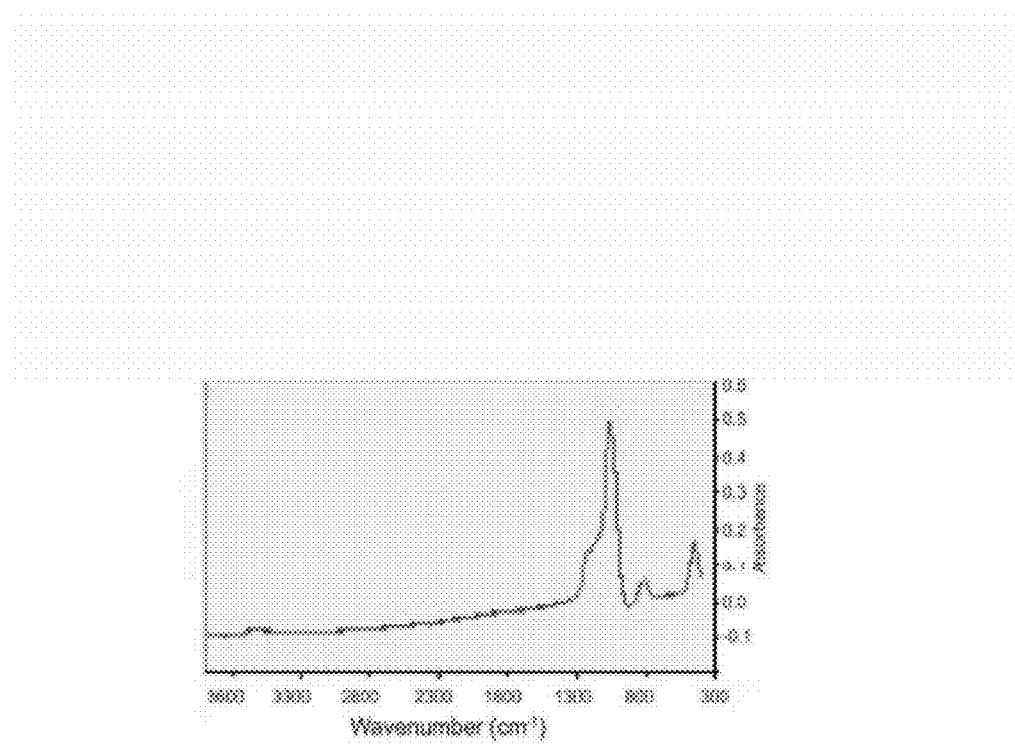

Column 10, lines 26-27 "FIGS. 5A and 5B" should be changed to --FIGS. 6A and 6B--.

Column 10, line 33 "FIGS. 5A and 5B" should be changed to --FIGS. 6A and 6B--.

Column 10, lines 53 "less that 0.5%" should be changed to --less than 0.5%--.

Column 11, line 63 "holes 44 faster than the top surface" should be changed to --holes 44 is faster at the top surface--.

Column 12, line 24 "The helium flow rate can from 2500" should be changed to --The helium flow rate can be from 2500--.

Column 13, lines 2-3 "before the etching the through holes" should be changed to --before etching the through holes--.

Column 13, line 58 "silicon layer 64" should be changed to --sealing layer 64--.

Column 13, line 59 "In the tank or sealing layer" should be changed to --The sealing layer 64.--

Signed and Sealed this
Thirty-first Day of December, 2013

Margaret A. Focarino
*Commissioner for Patents of the United States Patent and Trademark Office*

CERTIFICATE OF CORRECTION (continued)
U.S. Pat. No. 8,329,575 B2

Column 14, line 12 "sidewalls 49" should be changed to --sidewalls 48--.

Column 14, line 17 "bottom walls 41" should be changed to --bottom walls 49--.

Column 14, line 21 "second plate 20" should be changed to --silicon plate 20--.

Column 14, line 27 "bottom walls 41" should be changed to --bottom walls 49--.

Column 14, line 61 "silicon plates 20 with as well as" should be changed to --silicon plates 20 as well as--.

Column 14, line 62 "metallic conductors 47" should be changed to --metallic conductors 68--.

Column 15, line 6 "physical vapor deposition process (PVD)" should be changed to --physical vapor deposition (PVD)--.

Column 16, line 6 "water an acid" should be changed to --water, an acid--.

Column 16, line 23 "silicon plate 20 polished" should be changed to --silicon plate 20 is polished--.

Column 16, line 41 "silicon plate 25" should be changed to --silicon plate 20--.

Column 16, lines 41-42 "metallic conductor 47" should be changed to --metallic conductor 68--.

Column 17, line 39 "power of at a frequency" should be changed to --power at a frequency--.

Column 17, line 40 "electrodes 9a,b, and, for example" should be changed to --electrodes 9a,b, for example--.

Column 18, line 24 "ammonia is provided in a flow" should be changed to --ammonia in a flow--.

Column 19, line 21 ""g/cm$^3$ g/cm$^3$" should be changed to --g/cm$^3$--.

Column 22, line 26 "described herien" should be changed to --described herein--.

Column 23, line 11 "flow hard water," should be changed to --flow hard water),--.

Column 24, line 64 "alternatively comprising" should be changed to --alternatively comprise--.

Column 25, line 44 "substrate support 128 assembly 128." should be changed to --substrate support 128.--.

Column 28, line 13 "Table I" should be changed to --Table II--.

CERTIFICATE OF CORRECTION (continued)
U.S. Pat. No. 8,329,575 B2

Column 28, line 14 "describe herein" should be changed to --described herein--.

Column 28, line 37 "Table 1" should be changed to --Table 2--.

Column 28, line 53 "temperature of less 400°" should be changed to --temperature of less than 400°--.